United States Patent
Spath et al.

(10) Patent No.: US 11,248,292 B2
(45) Date of Patent: Feb. 15, 2022

(54) DEPOSITION SYSTEM WITH MOVEABLE-POSITION WEB GUIDES

(71) Applicant: Eastman Kodak Company, Rochester, NY (US)

(72) Inventors: Todd Mathew Spath, Hilton, NY (US); Carolyn Rae Ellinger, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 552 days.

(21) Appl. No.: 15/458,270

(22) Filed: Mar. 14, 2017

(65) Prior Publication Data
US 2018/0265982 A1    Sep. 20, 2018

(51) Int. Cl.
C23C 16/54     (2006.01)
C23C 16/455    (2006.01)
C23C 16/458    (2006.01)

(52) U.S. Cl.
CPC ...... *C23C 16/45551* (2013.01); *C23C 16/458* (2013.01); *C23C 16/545* (2013.01); *B65H 2301/51145* (2013.01)

(58) Field of Classification Search
CPC ............... B65H 2301/51145; C23C 16/45551
See application file for complete search history.

(56) References Cited

U.S. PATENT DOCUMENTS

| | | |
|---|---|---|
| 5,136,975 A | 8/1992 | Bartholomew et al. |
| 7,413,982 B2 | 8/2008 | Levy |
| 7,456,429 B2 | 11/2008 | Levy |
| 7,572,686 B2 | 8/2009 | Levy et al. |
| 7,789,961 B2 | 9/2010 | Nelson et al. |

(Continued)

FOREIGN PATENT DOCUMENTS

| | | |
|---|---|---|
| EP | 1 283 279 | 2/2003 |
| JP | 2005-179705 | 7/2005 |

OTHER PUBLICATIONS

E. Granneman, "Conduction Heating in RTP Fast, and Pattern-independent," Materials Science Forum, vols. 573-574, pp. 375-386.

(Continued)

*Primary Examiner* — Aiden Lee
(74) *Attorney, Agent, or Firm* — Kevin E. Spaulding; David A. Novais

(57) ABSTRACT

A thin film deposition system includes a web guide system having a plurality of web guides defining a web transport path for the web of substrate. The web guide system includes a moveable portion including first and second moveable-position web guides. A web transport control system advances the web of substrate along the web transport path at a web advance velocity. A deposition head is located along the web transport path between the first and second moveable-position web guides. A motion actuator system synchronously moves a position of the first and second moveable-position web guides such that they move forward and backward according to a defined oscillating motion pattern while maintaining a constant distance between the first and second moveable-position web guides, thereby causing a portion of the web of media adjacent to the deposition head to move forward and backward in an in-track direction.

25 Claims, 24 Drawing Sheets

(56) References Cited

U.S. PATENT DOCUMENTS

| | | |
|---|---|---|
| 7,850,780 B2 | 12/2010 | Levy et al. |
| 8,182,608 B2 | 5/2012 | Kerr et al. |
| 8,211,231 B2 | 7/2012 | Kerr et al. |
| 8,361,544 B2 | 1/2013 | Fedorovskaya et al. |
| 8,398,770 B2 | 3/2013 | Levy et al. |
| 8,420,168 B2 | 4/2013 | Kerr et al. |
| 8,529,990 B2 | 9/2013 | Fedorovskaya et al. |
| 2007/0137568 A1* | 6/2007 | Schreiber ............... C23C 14/042 118/718 |
| 2009/0130858 A1 | 5/2009 | Levy et al. |
| 2009/0304924 A1 | 12/2009 | Gadgil |
| 2009/0324971 A1* | 12/2009 | De Vries ........... C23C 16/45595 428/446 |
| 2010/0242842 A1* | 9/2010 | Takeuchi ............... C23C 14/562 118/718 |
| 2011/0097487 A1 | 4/2011 | Kerr et al. |
| 2011/0097488 A1 | 4/2011 | Kerr et al. |
| 2011/0097489 A1 | 4/2011 | Kerr et al. |
| 2011/0097490 A1 | 4/2011 | Kerr et al. |
| 2011/0097491 A1 | 4/2011 | Levy et al. |
| 2011/0097492 A1 | 4/2011 | Kerr et al. |
| 2011/0097493 A1 | 4/2011 | Kerr et al. |
| 2011/0097494 A1 | 4/2011 | Kerr et al. |
| 2011/0143019 A1* | 6/2011 | Mosso ................. C23C 16/545 427/58 |
| 2012/0282401 A1* | 11/2012 | Lee ....................... C23C 14/042 427/251 |
| 2014/0377963 A1 | 12/2014 | Ellinger et al. |
| 2016/0245434 A1 | 8/2016 | Seeley |

OTHER PUBLICATIONS

D. Levy et al., "Oxide Electronics by Spatial Atomic Layer Deposition," J. Display Technology, vol. 5, pp. 484-494 (2009).

P. Poodt et al., "Spatial atomic layer deposition: A route towards further industrialization of atomic layer deposition," J. Vac. Sci. Technol. A, vol. 30, pp. 010802-1-010802-11 (2012).

* cited by examiner

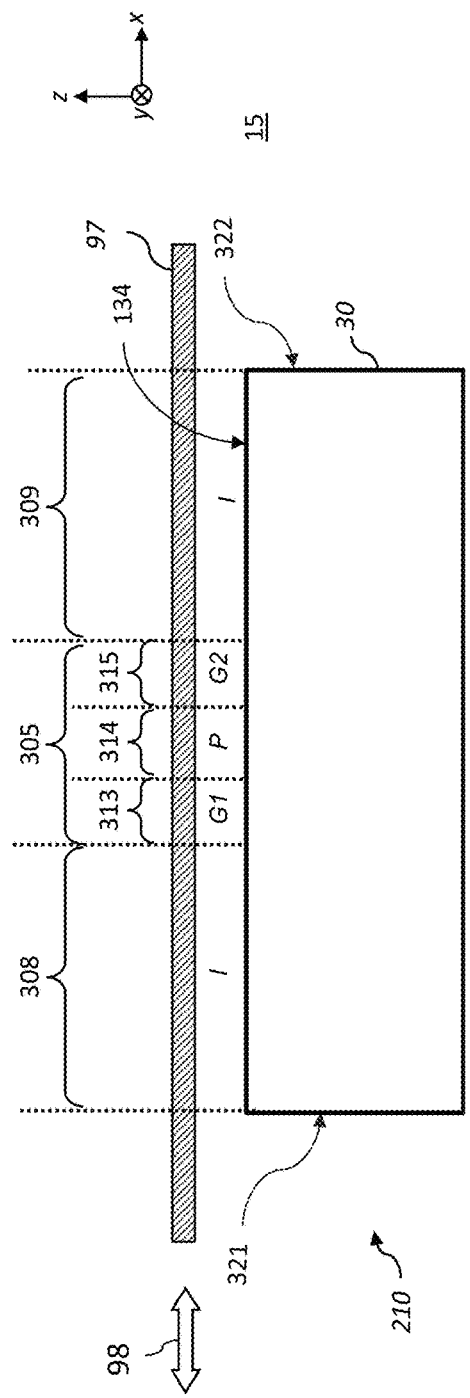
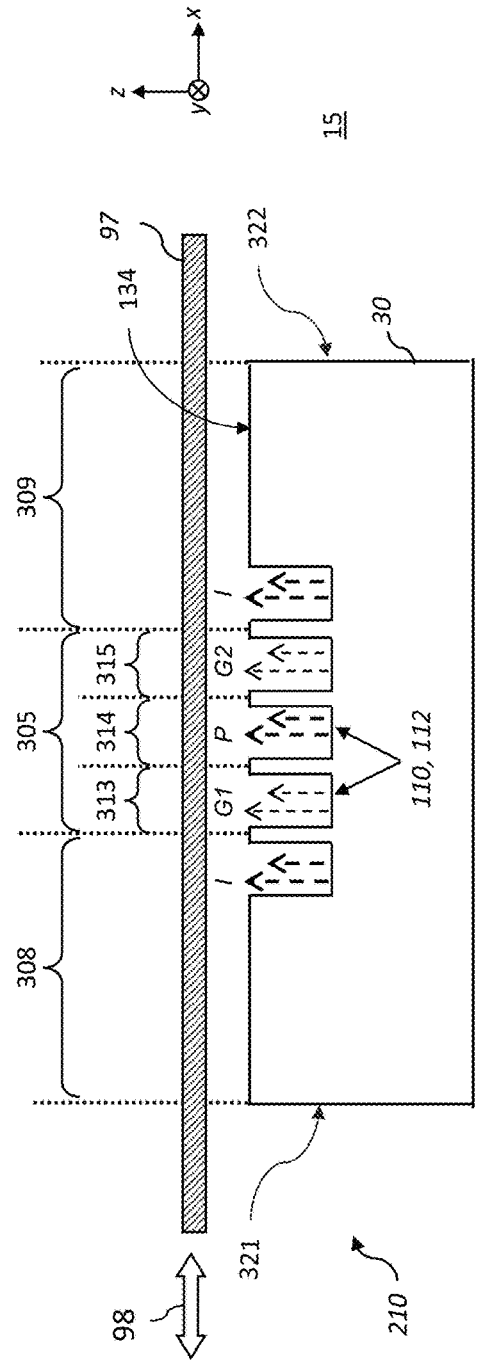
FIG. 2A
FIG. 2B

DEPOSITION SYSTEM WITH MOVEABLE-POSITION WEB GUIDES

CROSS-REFERENCE TO RELATED APPLICATIONS

Reference is made to commonly assigned, co-pending U.S. patent application Ser. No. 15/458,235, entitled "Modular thin film deposition system," by Spath et al.; to commonly assigned, co-pending U.S. patent application Ser. No. 15/458,250, entitled "Deposition system with vacuum pre-loaded deposition head," by Spath et al.; to commonly assigned, co-pending U.S. patent application Ser. No. 15/458,262, entitled "Dual gas bearing substrate positioning system," by Spath; to commonly assigned, co-pending U.S. patent application Ser. No. 15/458,287, entitled "Deposition system with repeating motion profile," by Spath et al.; to commonly assigned, co-pending U.S. patent application Ser. No. 15/458,297, entitled "Deposition system with modular deposition heads," by Spath et al.; to commonly assigned, co-pending U.S. patent application Ser. No. 15/458,307, entitled "Porous gas-bearing backer," by Spath; to commonly assigned, co-pending U.S. patent application Ser. No. 15/458,322, entitled "Deposition system with interlocking deposition heads," by Tutt et al.; to commonly assigned, co-pending U.S. patent application Ser. No. 15/458,335, entitled "Vertical system with vacuum pre-loaded deposition head," by Spath et al.; and to commonly assigned, co-pending U.S. patent application Ser. No. 15/458,345, entitled "Heated gas-bearing backer," by Spath, each of which is incorporated herein by reference.

FIELD OF THE INVENTION

This invention relates to systems for depositing a thin film of material on a web of substrate, and more particularly to a web transport system for controlling the position of a web of substrate in a process region of a thin film deposition system.

BACKGROUND OF THE INVENTION

There is a growing interest in depositing thin-film materials from gaseous precursors on a wide range of substrates for a wide variety of applications. Substrates of interest include both rigid substrates, such as flat-panel glass, and flexible substrates, such as plastic webs or metal foils. Flexible supports are of particular interest since they can be more mechanically robust, lighter weight, and allow for more economic manufacturing (e.g., by enabling roll-to-roll processing) than rigid substrates. Thin-film deposition systems, similar to their liquid coating counterparts, are advantaged if the deposition head, or gas delivery device, is smaller in area than the area of the substrate to be coated. For substrates that are continuous, such as webs and foils, the use of a deposition head that is smaller than the area of the substrate is a requirement not just an advantage.

Among the techniques widely used for thin-film deposition is chemical vapor deposition (CVD), which uses chemically reactive molecules that react to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Atomic layer deposition (ALD) is a thin-film deposition technology that provides excellent thickness control of conformal thin-films. The ALD process segments the thin-film deposition process of conventional CVD into single atomic-layer deposition steps. Advantageously, ALD steps are self-terminating and can deposit one atomic layer when conducted up to or beyond self-termination exposure times. An atomic layer typically ranges from about 0.1 to about 0.5 molecular monolayers, with typical dimensions on the order of no more than a few angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the absence of the other precursor or precursors of the reaction. In temporal vacuum ALD, thin-film growth is accomplished by alternating the delivery of two or more reactive materials, or precursors, into a vacuum chamber in time. Sequentially, a first precursor is applied to react with the substrate, the excess of the first precursor is removed, and a second precursor is then applied to react with the substrate surface. The excess of the second precursor is then removed and the process is repeated. In all ALD processes, the substrate is exposed sequentially to a series of reactants that react with the substrate and are kept isolated from each other to avoid CVD or gas phase reactions. An ALD cycle is defined by the steps required to form a single layer of the overall thin-film material; for a process using two precursors a cycle is defined as the first precursor exposure, a purge step, the second precursor exposure, and a second precursor purge step.

A version of ALD processes known as spatial atomic layer deposition (SALD) employs a continuous (as opposed to pulsed) gaseous material distribution from a deposition head. As distributed from the deposition head, the gaseous precursors are separated in space by the flow of an inert gas, rather than being separated in time. While vacuum chambers can be used with SALD, they are no longer necessary due to the physical separation of the gas flows rather than a temporal separation of the precursors within a single chamber. In SALD systems, the required sequential exposures are accomplished by relative movement between the substrate and the delivery head such that any given point on the substrate sees the necessary sequence of gaseous materials. This relative movement can be accomplished by moving a substrate relative to a fixed delivery head, moving a delivery head with respect to a fixed substrate, or moving both the delivery head and the substrate in order to achieve the desired gas exposure at the substrate. Exemplary SALD processes, are described in commonly-assigned U.S. Pat. Nos. 7,413,982, 7,456,429, 7,789,961, and U.S. Patent Application Publication 2009/0130858, the disclosures of which are incorporated herein by reference. SALD enables operation at atmospheric or near-atmospheric pressures and is capable of operating in an unsealed or open-air environment, making it compatible with web coating.

SALD offers considerable promise as a technique for thin film deposition on a range of substrates. However, in spite of its inherent technical capabilities and advantages, a number of technical hurdles still remain. As in all ALD processes, the thickness of the SALD deposited thin-film is controlled by the number of ALD cycles to which the substrate is exposed, where a cycle is defined by the exposure of the substrate to the minimum required reactant and purge gas flows to form the desired thin-film composition. Due to the process being limited to an atomic layer of growth per cycle, repeated cycles are required to deposit a thin-film having an appreciable thickness. In order to effectively achieve repeated cycles, SALD requires either motion of the substrate past the deposition head or the development of complex equipment such that the delivery head moves with its gas connections, relative to the substrate. Thin-films of appreciable thickness can be accomplished by either 1) using a deposition head containing a sufficient number of gas distribution cycles and moving a substrate (or head) in a unidirectional motion relative to the head (or substrate) or 2) using a head with a limited number of cycles and using relative reciprocating motion. In instances where the substrate or the deposition head are moved by a reciprocating movement, there remains a technical challenge to manage the sequence of gas exposures since the substrate can be exposed to the gases in a different sequence during a forward stroke and a backward stroke. Furthermore, in order to deposit a thin-film over an entire substrate, the substrate or the head may have to travel a long distance in order to expose substrate to the process gases. There remains a need to provide alternative arrangements to both the very large deposition heads and long distance motion profiles such that large substrates may be easily coated.

One alternative to a single large deposition head is to use multiple deposition heads, or modules, within a larger deposition section. Commonly-assigned U.S. Pat. No. 8,182,608 to Kerr et al., which is incorporated herein by reference, relates to an apparatus for maintaining the alignment or positional relationship between at least two modules in an SALD system. U.S. Pat. No. 8,182,608 describes aligning multiple delivery heads in a 1-D array, addressing the ability to coating longer substrates or provide thicker thin-film coatings. While simplifying the manufacturing of the deposition head, it does not address the challenge of making coatings of different thicknesses using the same tool, or the footprint required for providing a large deposition section in a manufacturing environment. Additionally, there remains a need for a way to arrange modular heads to be able to coat wider substrates without coating defects or non-uniformity. Additionally, there remains a need for a motion profile that enables the use of small deposition heads in order to build up a sufficient layer thickness from an SALD. Furthermore, there remains a need for a substrate handling means for coating on roll-to-roll webs that enables exposure of the substrate to multiple SALD cycles during deposition, while simultaneously moving the substrate smoothly from the feed roll to the take-up roll.

In order to function properly, an SALD system must maintain the separation of the reactant gases. Although separated in space and by a purge gas as delivered by the deposition head, the system must be further designed to insure that the gases do not mix in the region between the deposition head and the substrate. Commonly-assigned U.S. Patent Application Publication 2009/0130858 to Levy, relates to an SALD deposition system and method using a delivery head where the distance between the substrate and the deposition head is maintained by gas pressure. In this device, the pressure of flowing reactive and purge gases is used as a means to control the separation between the deposition head and the substrate. Due to the relatively large pressures that can be generated in such a system, gases are forced to travel in well-defined paths and thus eliminate undesired gas intermixing.

The system of U.S. Patent Application Publication 2009/0130858 operates as a gas-bearing SALD system. The gas bearing operation maintains a close proximity of the substrate to the deposition head, and either the substrate or head must be free to move in the direction normal the deposition head. The use of a gas bearing SALD head is advantaged due to the resultant pressure profiles that separate the precursor gasses by the purge gas and prevent undesired gas intermixing. There remains a need for SALD systems that utilize a gas-bearing deposition head to coat large substrates, particularly for depositions systems with small manufacturing footprints. There remains a need to coat long substrates with deposition heads that are considerably smaller than the coating length, both for piece-parts and particularly for roll-to-roll webs; this need further necessitates novel motion control profiles and substrate handling. There remains a further need for roll-to-roll SALD systems that utilize a gas-bearing deposition head having a simple construction, as well as roll-to-roll systems that can manage potential substrate distortions and can isolate the motion needed for deposition from the global motion of the web through the system. Additionally, there remains a need, for a modular system that can accommodate different substrate form factors, including roll-to-roll webs of substrate, and provide a system that is relatively low in cost and easy to use.

SUMMARY OF THE INVENTION

The present invention represents a thin film deposition system for depositing a material onto a web of substrate travelling in an in-track direction along a web transport path, including:

a web guide system having a plurality of web guides defining a web transport path for the web of substrate, the web guide system including:
  an entrance portion
  an exit portion; and
  a moveable portion along the web transport path between the entrance portion and the exit portion, the moveable portion including:
    a first moveable-position web guide; and
    a second moveable-position web guide;
  wherein the web transport path directs the web of substrate through the entrance portion, then around the first moveable-position web guide, then around the second moveable-position web guide, then through the exit portion;

a web transport control system that advances the web of substrate along the web transport path at a web advance velocity;

a deposition head for depositing the material onto a surface of the web of substrate as the web of substrate moves past the deposition head, the deposition head being located in a fixed position adjacent to the web of substrate along the web transport path between the first moveable-position web guide and the second moveable-position web guide; and a motion actuator system that synchronously moves a position of the first and second moveable-position web guides such that they move forward and backward in a moveable portion motion direction according to a defined oscillating motion pattern while maintaining a constant distance between the first and second moveable-position web guides, thereby causing a portion of the web of media adjacent to the deposition head to move forward and backward in an in-track direction;

wherein the web of substrate enters and exits the first and second moveable-position web guides in directions that are substantially parallel to the moveable portion motion direction.

An advantage of the present invention is that that the length of the web of substrate along the web transport path is constant, regardless of the motion of the moveable portion. As a result, the web tension is maintained at a steady value. This enables dancer roll tension sensing devices to be utilized in systems without inducing a periodic disturbance. It is a further advantage that the primary web motion can be controlled independent of the motion of the moveable portion, and can be stopped, or accelerated asynchronously.

It is a further advantage that the amplitude of the oscillatory motion of the web of media is an integer multiple the motion amplitude of the moveable portion. The reduces overall length of motion components, which reduces cost and allows for compact apparatus. Furthermore, it is desirable to accelerate the oscillating portion of the web of substrate as rapidly as possible so that short targeted gas exposure times may be achieved, with as much of the oscillation stroke length taking place at constant speed. Rapid acceleration also increases throughput by reducing the total time per oscillation at a given stroke length and terminal velocity. It is an advantage of the present invention that the linear acceleration of the web of substrate within the process region is an integer multiple of the acceleration of the moveable portion.

It is an advantage of configurations using gas bearing turn bars that there is no angular acceleration required of the web guidance apparatus when the web of substrate changes tangential velocity. It is also an advantage that the incoming velocity of the web can be measured by the rotation speed of fixed-position rollers at the entrance or exit of the web apparatus.

BRIEF DESCRIPTION OF THE DRAWINGS

FIGS. 2A-2C are cross-sectional side views of SALD deposition heads useful in the present invention having a single ALD cycle;

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 1:
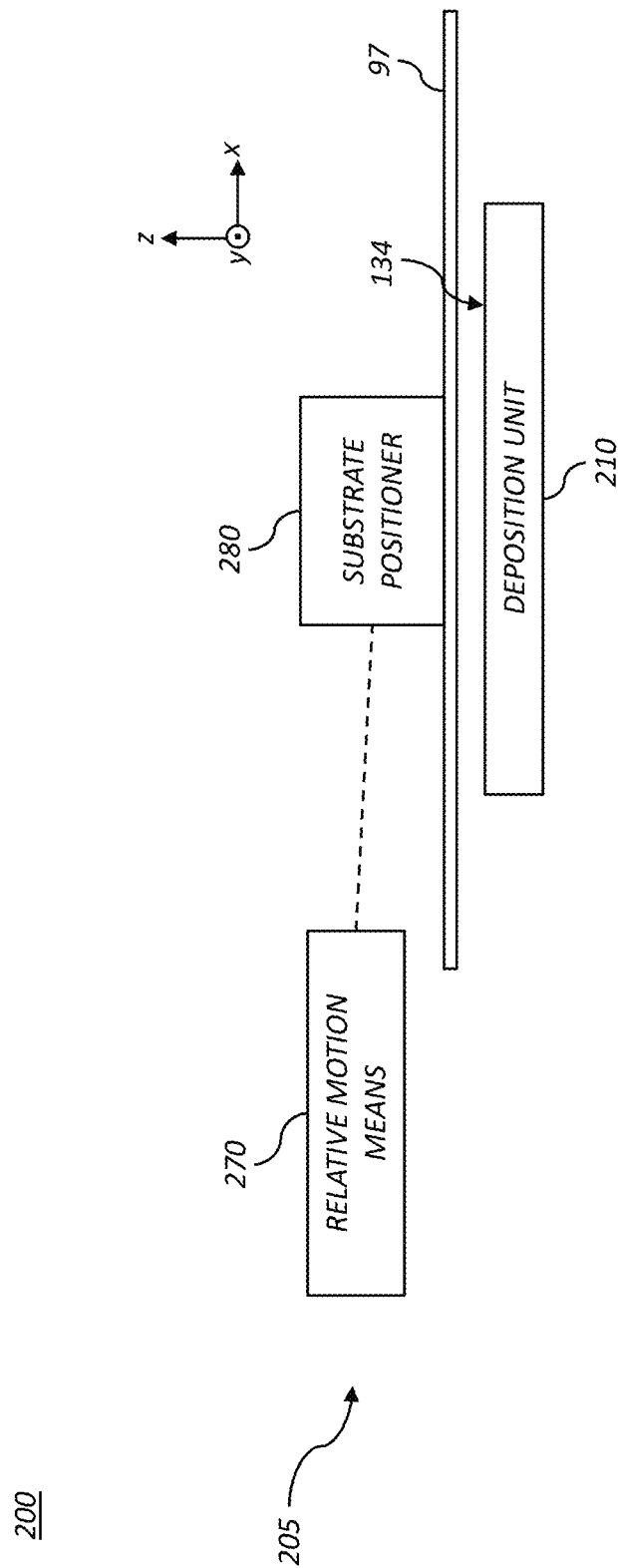
FIG. 1 is schematic block diagram showing the functional elements of an SALD deposition system.

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "on," "over," "top," "bottom," "left," and "right" are used with reference to the orientation of the figure(s) being described. Because components of embodiments of the present invention can be positioned in a number of different orientations, the directional terminology is used for purposes of illustration only and is in no way limiting.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are generally not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense. Even though specific embodiments of the invention have been described herein, it should be noted that the present invention is not limited to these embodiments. In particular, any features described with respect to one embodiment may also be used in other embodiments, where compatible. The features of the different embodiments can be exchanged, where compatible.

It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and are not to scale for the sake of clarity. One of ordinary skill in the art will be able to readily determine the specific size and interconnections of the elements of the example embodiments of the present invention. Therefore, the provided figures are not drawn to scale but are intended to show overall function and the structural arrangement of some embodiments of the present invention.

The embodiments of the present invention relate components for systems useful for thin-film deposition. In preferred embodiments, the thin-film deposition is done using a spatial atomic layer deposition (SALD) process. For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. Reactant gas flows can include multiple reactive species together with inert gaseous species. In some embodiments, the reactive gases can include a reactive plasma, such as supplied by a remote plasma source. One type of remote plasma source that can be used includes a surface dielectric barrier discharge source. As such, plasma-enhanced spatial ALD (PE-SALD) arrangements are considered to be useful in some embodiments. While the exemplary embodiments are described in the context of SALD systems, those skilled in the art will recognize that aspects of the present invention can also be used for any application which involves exposing a substrate to one or more gaseous substances, such as chemical vapor deposition processes.

Unless otherwise explicitly noted or required by context (for example, by the specified relationship between the orientation of certain components and gravity), the term "over" generally refers to the relative position of an element to another and is insensitive to orientation, such that if one element is over another it is still functionally over if the entire stack is flipped upside down. As such, the terms "over", "under", and "on" are functionally equivalent and do not require the elements to be in contact, and additionally do not prohibit the existence of intervening layers within a structure. The term "adjacent" is used herein in a broad sense to mean an element next to or adjoining another element. The figures provided are not drawn to scale but are intended to show overall function and the structural arrangement of some embodiments of the present invention.

Embodiments of the present invention are illustrated and described with a particular orientation for convenience; and unless indicated specifically, such as by discussion of gravity or weight vectors, no general orientation with respect to gravity should be assumed. For convenience, the following coordinate system is used: the z-axis is perpendicular to the output face of the deposition head, the x-axis is parallel to the primary motion direction (in the plane of the output face), and the y-axis is perpendicular to the primary motion axis (in the plane of the output face). Roll, pitch, and yaw are as used herein have their commonly understood definitions. To facilitate interpretation of relative motion and degrees of freedom, the following clarifications are provided. Roll is the rotation about an axis parallel to the primary motion axis (x-axis). Pitch is the rotation about the y-axis in the plane of the output face of the delivery device and perpendicular to the primary motion axis. Yaw is the rotation about the z-axis which is normal to the output face of the delivery device.

An ALD process accomplishes thin-film growth on a substrate by the alternating exposure of two or more reactive materials, commonly referred to as precursors, either in time or space. A first precursor is applied to react with the substrate. The excess of the first precursor is removed and a second precursor is then applied to react with the substrate surface. The excess of the second precursor is then removed and the process is repeated. In all ALD processes, the substrate is exposed sequentially to a series of reactants that react with the substrate. The thickness of the ALD (and SALD) deposited thin-films is controlled by the number of ALD cycles to which the substrate is exposed, where a cycle is defined by the exposure to the minimum required reactant and purge gas flows to form the desired thin-film composition. For example, in a simple design, a single cycle can provide one application of a first reactant gaseous material G1 and one application of second reactant gaseous material G2. In order to effectively achieve repeated cycles, SALD requires either motion of the substrate past the deposition head or the development of complex equipment such that the delivery head with its gas connections, can be moved relative to the substrate. Thin-films of appreciable thickness can be accomplished by either 1) using a deposition head containing a sufficient number of gas distribution cycles and moving the substrate (or the deposition head) in a unidirectional motion relative to the deposition head (or substrate) or 2) using a deposition head with a limited number of cycles and using relative reciprocating motion.

In order to effectively use an SALD deposition head for thin-film deposition, it is commonly employed within a larger SALD system, or apparatus. Typically, such systems are specifically designed to deposit thin films on a particular type of substrate (for example, either rigid or flexible). Furthermore, SALD systems typically utilize a singular motion profile type that is chosen as a result of the design of the deposition head and the type of substrate being coated. In many cases, SALD systems are further designed for a specific application, and as such are configured to coat a single material at a given thickness on a substrate having a particular form factor.

As known by one skilled in the art, each SALD system requires at least three functional elements in order to effectively deposit a thin-film, namely a deposition unit, a substrate positioner and a means of relative motion. To date, the specific design of each functional element has generally differed from system to system. As will be described, preferred embodiments of the SALD systems of the present invention are modular in nature, and as such includes a range of components of differing design that can be exchanged to perform the function of a particular functional element within the novel SALD platform. The design and advantages of specific components useful in a range of SALD systems, and design and advantages of inventive elements and configurations of the novel modular SALD platform of the present invention will be better understood with respect to the Figures.

As shown in schematic block diagram of FIG. 1, SALD system 200 of the present invention is preferably one in which a substrate 97 is moved relative to a fixed deposition unit 210. As such, substrate 97 is positioned over the output face 134 of a deposition unit 210 by substrate positioner module 280, and relative motion between the substrate 97 and the deposition unit 210 is accomplished by motion of the substrate positioner module 280 using relative motion means 270, which can also be referred to as a motion controller or a motion control means. The deposition unit 210, substrate positioner module 280 and relative motion means 270 are functional elements of deposition subsystem 205 of SALD system 200. In various embodiments of the present invention, the deposition unit 210 can be a single deposition head 30 or can be a deposition unit that include an array of deposition heads 30. The relative motion means 270 interacts with the substrate positioner module 280 to move the substrate 97 relative to the deposition unit 210.

The substrate positioner module 280 is preferably an interchangeable substrate positioning module, with the modular system having multiple substrate positioning modules that can be easily exchanged into the SALD system 200, where the different substrate positioning modules are configured to handle different types of substrates 97 and different substrate form factors.

Many types of substrates can be coated with the SALD system 200. The substrates 97 used in the present invention can be any material that acts as a mechanical support for the subsequently coated layers. The substrate 97 can include a rigid material such as glass, silicon, or metals. The substrate can also include a flexible material such as a polymer film or paper. Useful substrate materials include organic or inorganic materials. For example, the substrate can include inorganic glasses, ceramic foils, and polymeric materials. The thickness of substrate 97 can vary, typically from about 25 μm to about 1 cm. Using a flexible substrate 97 allows for roll processing, which can be continuous, providing economy of scale and economy of manufacturing relative to flat or rigid supports.

In some example embodiments, the substrate 97 can include a temporary support or support material layer, for example, when additional structural support is desired for a temporary purpose, e.g., manufacturing, transport, testing, or storage. In these example embodiments, the substrate 97 can be detachably adhered or mechanically affixed to the temporary support. For example, a flexible polymeric support can be temporarily adhered to a rigid glass support to provide added structural rigidity during the deposition process. The glass support can be removed from the flexible polymeric support after completion of the manufacturing process. The substrate 97 can be bare indicating that it contains no substantial materials on its surface other the material from which it is composed. The substrate 97 can include various layers and patterned materials on the surface.

The relative motion means 270 is adapted to connect to the interchangeable substrate positioner modules, and as such, the relative motion means 270 and the interchangeable substrate positioner modules preferably contain appropriate mating features. The substrate positioner module 280 is designed to position the substrate 97 in the x- and y-directions relative to the output face 134 of the deposition unit 210. The SALD system 200 may also include a secondary substrate positioner (not shown) which is designed to control the position of the substrate 97 in the z-direction.

In various configurations, the substrate 97 can be attached to a backer device during deposition. The backer device can be used as heat source for the substrate, or to stiffen otherwise flexible substrates. A backer that is temporarily attached to the substrate, by vacuum for example, is intended to move with the substrate during relative motion between the substrate and a fixed deposition head. The backer attachment can provide greatly increased rigidity and flatness to flexible substrates. A backer device useful in the present invention can be larger than the substrate, as might be used to stabilize piece-parts of flexible substrate or approximately the same size as the substrate, or significantly smaller than the substrate when the substrate is rigid and self-supporting. As used herein, the "substrate unit" refers to either the substrate 97 alone or a substrate 97 with an attached backer device; the substrate unit has relative motion relative to the deposition unit 210.

Figure 2C:
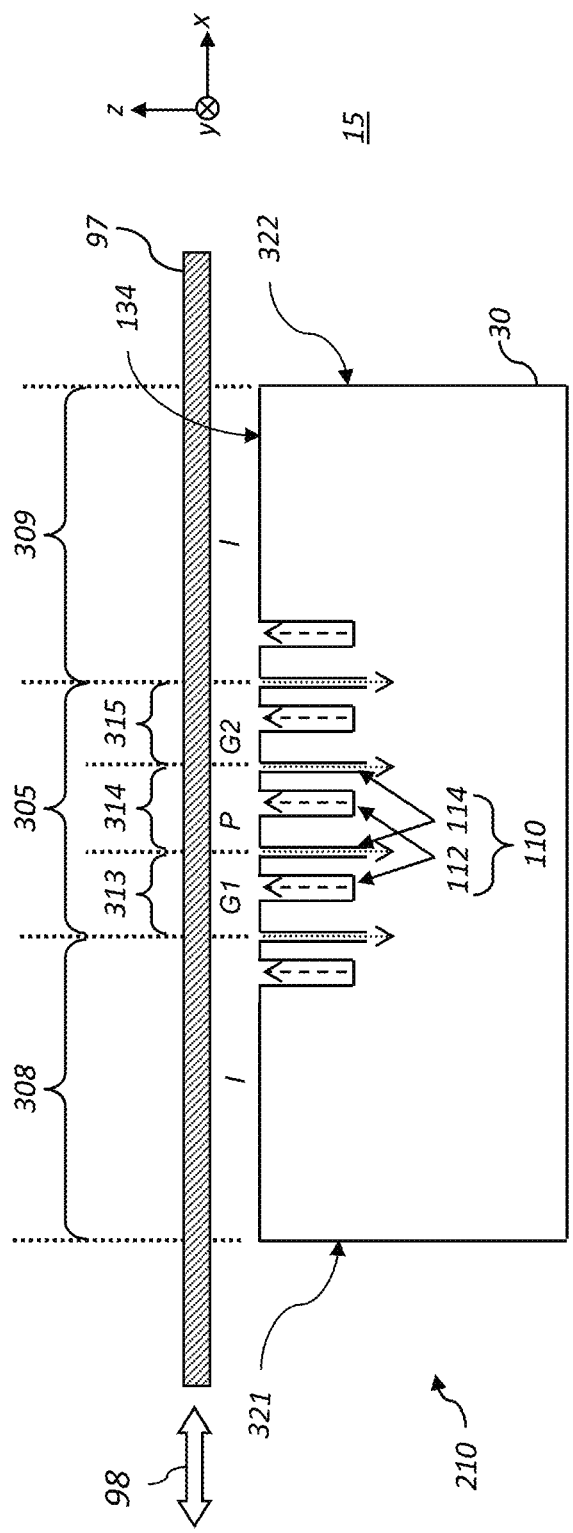

The deposition unit 210 can use any type of SALD deposition head that is known in the art. FIGS. 2A-2C illustrate deposition heads 30 that are configured to simultaneously supply a plurality of gaseous materials from the output face in different gas zones within a deposition zone 305. In all three figures, the deposition zone 305 contains the necessary gas zones for a single two-step ALD deposition cycle. Moving from left to right within the deposition zone 305, there is a first reactive gas zone 313 (G1) followed by an inert gas purge zone 314 (P), and a second reactive gas zone 315 (G2). As the relative motion means 270 (FIG. 1) moves the substrate 97 relative to the deposition head 30 (the x-direction being the primary motion direction as indicated by motion arrow 98), a particular location on the substrate 97 sees the above sequence of gases which results in ALD deposition. Deposition heads 30 of the present can include a deposition zone 305 with gas zones for any number of ALD deposition cycles, the single ALD cycle illustrated is for clarity of understanding.

The SALD systems of the present invention can use any deposition head geometry so long it has the required gas delivery to form gas zones between the deposition head 30 and the substrate 97 in the required order to accomplish an ALD cycle, as illustrated by the simplified deposition head 30 of FIG. 2A. In preferred embodiments, the reactive gases (G1 and G2, for example) have little or no intermixing to avoid a CVD component during film deposition or gas phase reactions. The purge zone 314 (P) serves to separate the reactive gases G1, G2 and allows for the removal of any reaction byproducts from the substrate surface as it moves through the purge zone 314.

A single deposition cycle (moving from left to right) is defined by an inert gas flow I, followed by a first reactive gas flow G1, followed by an inert purge gas flow P, and lastly by a second reactive gas flow G2. The deposition zone 305 has a deposition zone length that spans the distance from the start of the first reactive gas zone to the end of the last reactive gas zone (e.g., from the first reactive gas zone 313 to the second reactive gas zone 315 in FIG. 2A).

The deposition heads 30 illustrated in FIGS. 2A-2C, have extended inert zones 308, 309 on either side of the deposition zone 305. The first inert zone 308 has a first inert zone length that spans the distance from the left edge 321 of the deposition head 30 to the boundary of the first reactive gas zone 313. The second inert zone 309 has a second inert zone length that spans the distance from the boundary of the second reactive gas zone 315 to the right edge 322 of the deposition head 30. The extended inert zones 308, 309 isolate the deposition zone 305 from the external environment 15 and enable the deposition head 30 to coat substrates 97 that are substantially longer than the length of the deposition head 30 without exposing the growth region to the external environment 15. Deposition heads of the prior art are typically operated within a larger system where the external environment is controlled to be inert, under vacuum, or both. In preferred embodiments of the present invention, the deposition head 30 can be used at atmospheric pressure without any additional environmental controls for the external environment 15. One of the advantages of the present invention is that the deposition head 30 and SALD system 200 containing it can be used to coat on substrates 97 whose length is much larger than the length of the deposition zone 305. A further advantage of some embodiments of the present invention is the ability to control the environment of the region of the substrate being actively coated during deposition. Additionally, the relatively small deposition head size allows for lower cost manufacturing of the deposition head.

It is known that ALD is self-limiting, meaning that when all available sites on a substrate surface have reacted with a precursor there is no further reaction during that half-step. When both half-reactions in a deposition cycle have sufficient time and available precursor to reach this state, it is said that the ALD cycle has reached "saturation". ALD depositions done in these conditions are by definition, saturated ALD, and continued exposure to the precursors does not change significantly the deposition amount. In SALD, the substrate velocity and length of reaction zones determine the exposure time to a give precursor. For a given velocity, there is a minimum zone length required to reach saturation (i.e., a "saturation length") and zone lengths longer than the saturation length do not add film thickness during material deposition. SALD systems of the present invention can be used in both saturated and sub-saturated conditions. One advantage of the present invention is that sub-saturated growth can still be deterministic, since each point on the substrate 97 will see the same concentration of precursors for a time which is set by the substrate velocity and motion profile.

The motion arrow 98 indicates one known motion of the substrate 97 useful in SALD which is to move the substrate 97 in a smooth oscillating, or reciprocating, motion through the entire deposition zone 305 such that the substrate "sees" the required number of cycles to produce the desired coating thickness (as discussed above). In preferred embodiments of the present invention the substrate motion is controlled such that the region being actively coated is prevented from experiencing the external environment during coating. This has the advantage of avoiding contamination of the thin-films during growth by preventing exposure to any reactive species or dust particulates or other contaminates that may be present in the external environment outside of the controlled environment defined by the region between the deposition head 30 and the substrate 97.

The deposition head 30 of FIG. 2B illustrates an embodiment where one or more of the gas zones use a transverse arrangement, such as that disclosed in the aforementioned commonly-assigned U.S. Pat. No. 7,456,429 (Levy et al.), entitled "Apparatus for atomic layer deposition." In a transverse flow arrangement, the flow of gases during deposition is orthogonal, or transverse, to the direction of substrate motion and is exhausted either out the edges of the deposition head 30, or into exhaust slots along the perimeter of the deposition head 30. As illustrated, the deposition head 30 has gas slots 110 (i.e., output slots 112) that are configured to supply the gases into their corresponding gas zones. In other embodiments, the deposition head 30 provides gas to the elongated parallel gas zones through an array of orifices, rather than through the illustrated output slots 112 (elongated channels).

The deposition head 30 of FIG. 2C illustrates a preferred gas bearing deposition head 30 of the present invention. The principles and design of gas bearing deposition heads 30 has been described in detail in the aforementioned U.S. Patent Application Publication 2009/0130858, as well as in commonly-assigned U.S. Pat. No. 7,572,686 (Levy et al.) and entitled "System for thin film deposition utilizing compensating forces." As shown in FIG. 2C, an exemplary deposition unit 210 includes a deposition head 30 that operates on a vacuum-preloaded gas bearing principle having an output face 134 (facing upward) having gas slots 110 which provide gases into the gas zones and exhaust gases from the gas zones. Gases are provided into the gas zones by spatially separated elongated output slots 112 (extending in the y-direction). Each gas zone includes a corresponding output slot 112. Adjacent exhaust slots 114 remove (or exhaust) gas from the gas zones. The exhaust slots 114 are positioned to define the boundaries of the various gas zones. As illustrated, the gas zones are equivalent to those of FIGS. 2A and 2B.

In these preferred embodiments wherein the deposition head 30 operates using a gas bearing principle the substrate 97 is positioned above the output face 134 of the deposition head 30 and is maintained in close proximity to the output face 134 by an equilibrium between the pull of gravity, the flow of the gases supplied to the output face 134 through the output slots 112, and a slight amount of vacuum at the exhaust slots 114. While the gas openings in this example are gas slots 110 (also referred to as gas channels) that extend in the y-direction, one skilled in the art will recognize that the gas openings could also have other geometries, such as a row of nozzles or circular orifices, so long as the proper gases are delivered into and exhausted from the gas zones between the deposition head and the substrate.

As shown in FIG. 2C, the gases are introduced and exhausted in alternating output slots 112 and exhaust slots 114 in the output face 134 of the deposition head 30. The flow of gases between the output slots 112 during deposition is primarily in the direction of substrate travel (forward and backward) toward the adjacent exhaust slots 114. As discussed earlier, the region that spans the reactive gas zones can be referred to as the deposition zone 305, which is preferably surrounded by two inert zones 308, 309. The individual gas zones within the deposition zone 305, where the substrate 97 is exposed to each gas, generally extend outward from the corresponding output slot 112 to the two adjacent exhaust slots 114 as illustrated for the first reactive gas zone 313, the purge zone 314, and the second reactive gas zone 315. In the illustrated configuration, the extended inert zones 308, 309 extend from the inert gas output slots 112 to the edges of the deposition head 30. In alternative embodiments, the extended inert zones 308, 309 can include additional output slots 112 or other gas supply features. Additionally, the extended inert zones 308, 309 can include exhaust slots 114, or other exhaust features, to provide additional protection/separation from the external environment 15.

Using any of the embodiments of deposition head 30 of FIGS. 2A-2C, an SALD deposition process can be accomplished by oscillating the position of the substrate 97 across the deposition head 30 (in the in-track direction indicated by the motion arrow 98) for the number of cycles necessary to obtain a uniform deposited film of the desired thickness for the given application.

Figure 3A:
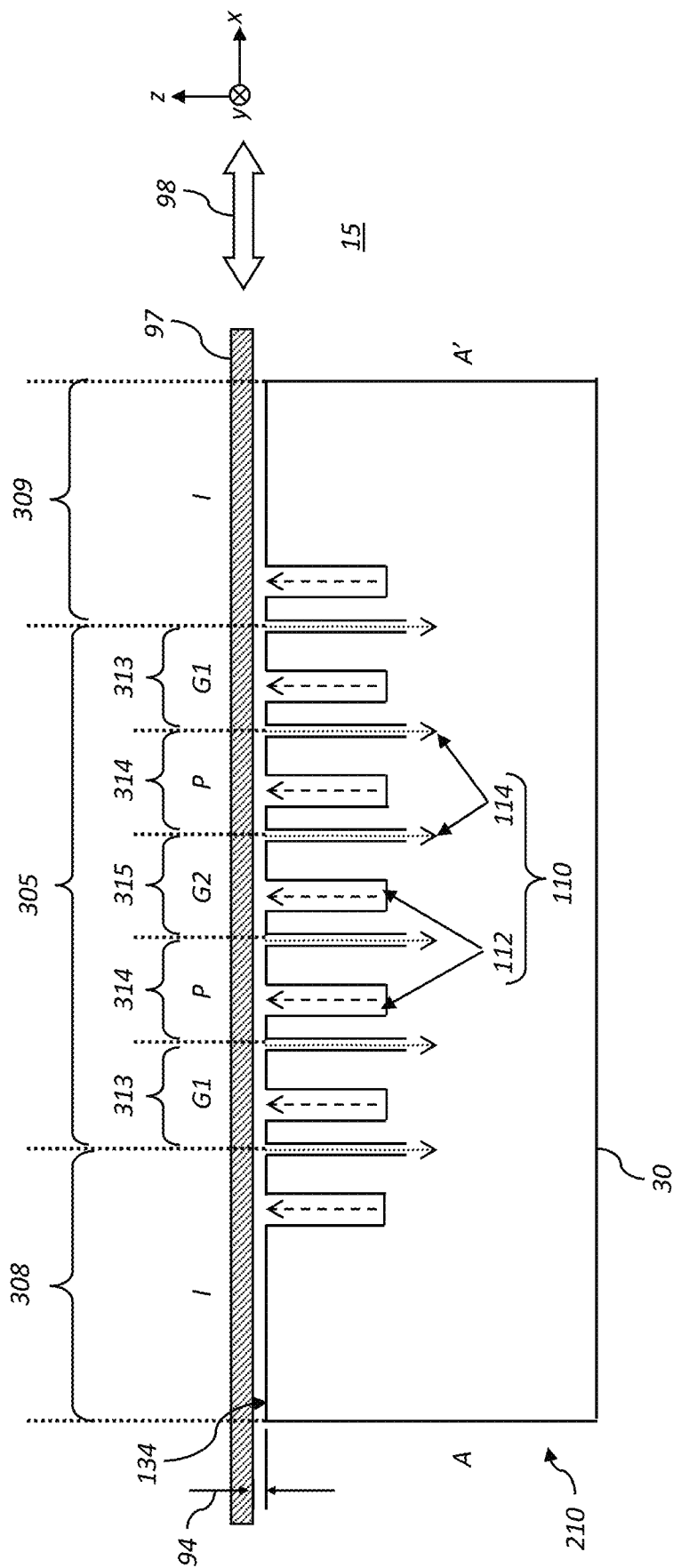
FIG. 3A is a cross-sectional side view of an alternative embodiment of an SALD deposition head having 1.5 ALD cycles.
Figure 3B:
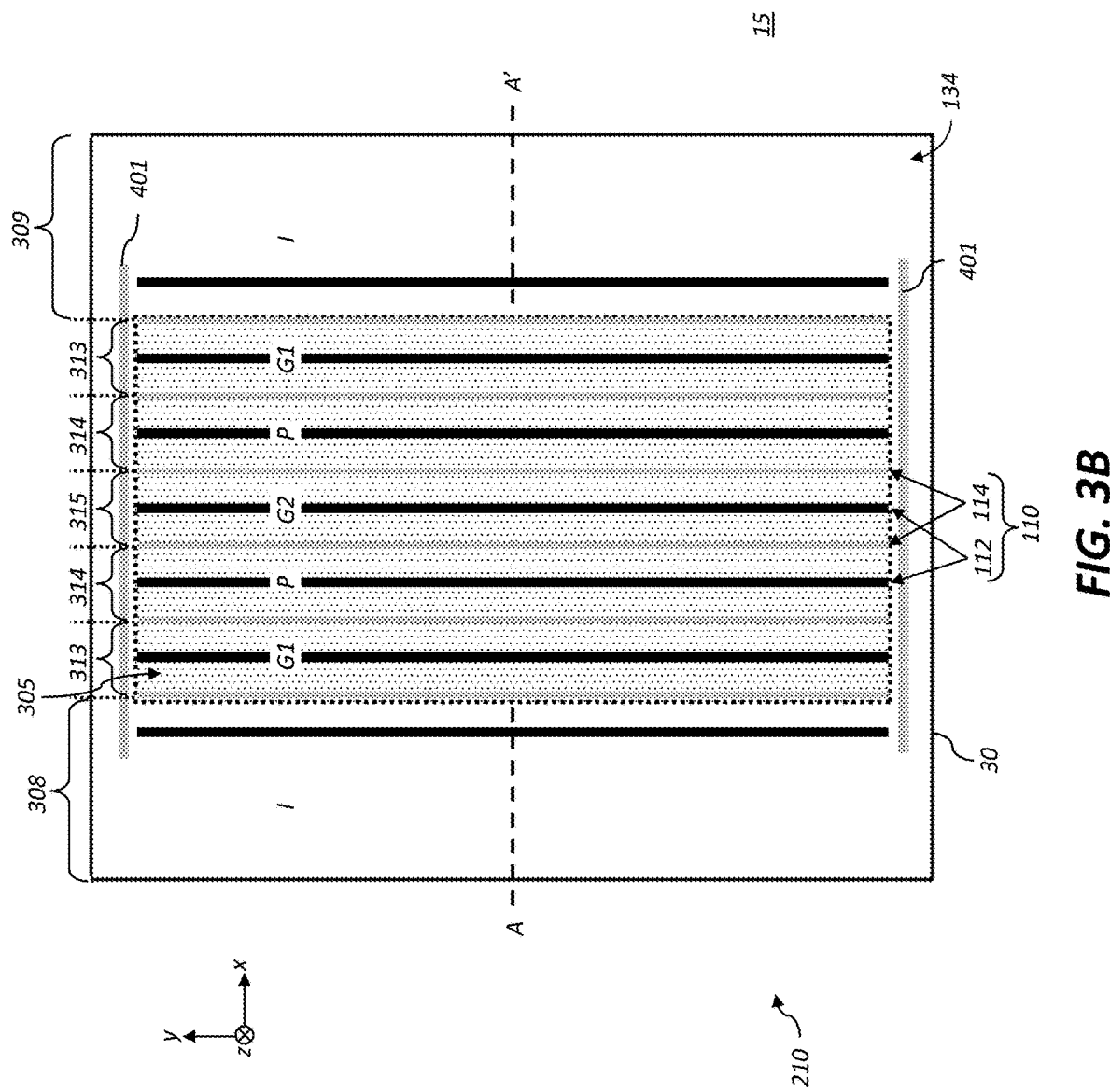
FIG. 3B is a plan view of the SALD head of FIG. 3A.

FIG. 3A is a cross-sectional view of a deposition head 30 illustrating a preferred embodiment of the present invention where the deposition zone 305 is arranged to be symmetric, so that as the substrate 97 is moved relative to the deposition head 30 a position can "see" a full cycle exposure in either a forward or reverse direction. FIG. 3B illustrates a plan view corresponding to the cross-sectional view of FIG. 3A, where the cross-sectional view is taken along the line A-A' of the plan view. In common parlance, the deposition head 30 illustrated in FIG. 3A-3B can be referred to a "one-and-a-half cycle head" or a "1.5 cycle head." Moving from left-to-right through the deposition zone 305, the substrate 97 is exposed to (in order) a first reactive gas zone 313 where the substrate is exposed to a first reactive gas G1, an inert purge zone 314 where the substrate is exposed to an inert purge gas P, a second reactive gas zone 315 where the substrate is exposed to a second reactive G2, another inert purge zone 314 where the substrate is exposed to the purge gas P, and another first reactive gas zone 313 where the substrate is exposed to the first reactive gas G1. Moving in the reverse direction from right-to-left through the deposition zone 305, the substrate 97 is exposed to the same sequence of gases as in the forward (left-to-right) direction, namely the first reactive gas G1, the inert purge gas P, the second reactive gas G2, the inert purge gas P, and the first reactive gas G1. The advantage of this symmetry is that feeding the substrate 97 from left-to-right or right-to-left results in equivalent exposure, and entrance and exit sides of the deposition head 30 depend of the direction of relative motion of the substrate 97 not the design of the deposition head 30.

As with the previous embodiments, the gas zones (or regions) are between the substrate 97 and the deposition head 30. The labels in FIG. 3A are placed above the substrate for clarity and to further emphasize the small working distance 94 between the process-side of substrate 97 and the output face 134 of the deposition head 30 enabled by the use of a vacuum-preloaded gas bearing deposition head 30. As illustrated in the plan-view of FIG. 3B, in addition to the output slots 112 (shown as black lines) and the exhaust slots 114 (shown as gray lines) in the deposition zone 305 (shown as a shaded area), there are additional output slots 401 orthogonal to the gas slots 110 in the deposition zone 305. The additional gas output slots 401 provide inert gas to the cross-track edge region of the deposition head 30, providing further isolation of the deposition zone 305 from the external environment 15.

The exemplary gas bearing deposition head 30 of FIG. 3A has gas slots 110 corresponding to 1.5 ALD cycles to provide the proper sequence of gas exposure in the forward and reverse directions. As the substrate 97 is oscillated back and forth over the deposition head 30, it will provide only a single ALD cycle (one G1 and one G2 exposure) per single direction pass over the deposition head 30, therefore a round trip oscillation provides two ALD cycles. Furthermore, when the second precursor G2 is reactive with the external environment, while the first precursor G1 is not, this arrangement provides additional protection against unwanted reactions involving G2. An example of a precursor pair that would benefit from this arrangement is water and trimethylaluminum (TMA), where water is the non-reactive precursor G1 and TMA is the highly reactive precursor G2.

The deposition head 30 is preferably constructed of a material which does not react with the precursor gases and can withstand the required temperatures without significant deformation. One preferable material is stainless steel. It is recognized that other materials can also be used, but differential thermal expansions must be kept low to prevent distortions. As described, the deposition head 30 delivers multiple reactive and inert process gasses through output face 134. Connection of the various gas sources to the deposition head 30 can be accomplished using individual pipe or tubing connections distributed about the periphery of the deposition head 30. In an exemplary configuration, commercially available fittings, such as Swagelok VCR series components, are used for gas source connections. In preferred embodiments, the gases are supplied to the deposition head 30 via a manifold.

A relatively clean external environment is useful to minimize the likelihood of contamination, but is not necessary. Full "clean room" conditions or an inert gas-filled enclosure can be used in systems of the present invention, however preferred embodiments do not be require control of the external environment and are advantaged for that reason. The apparatus of the present invention is advantaged in its capability to perform deposition onto a substrate 97 over a broad range of temperatures, including room temperature, or near-room temperature, in some embodiments. The apparatus of the present invention can operate in a vacuum environment, but is particularly well suited for operation at or near atmospheric pressure. In preferred embodiments, the SALD process can be performed at or near atmospheric pressure and over a broad range of ambient and substrate temperatures, preferably at a temperature of under 300° C.

Figure 4:
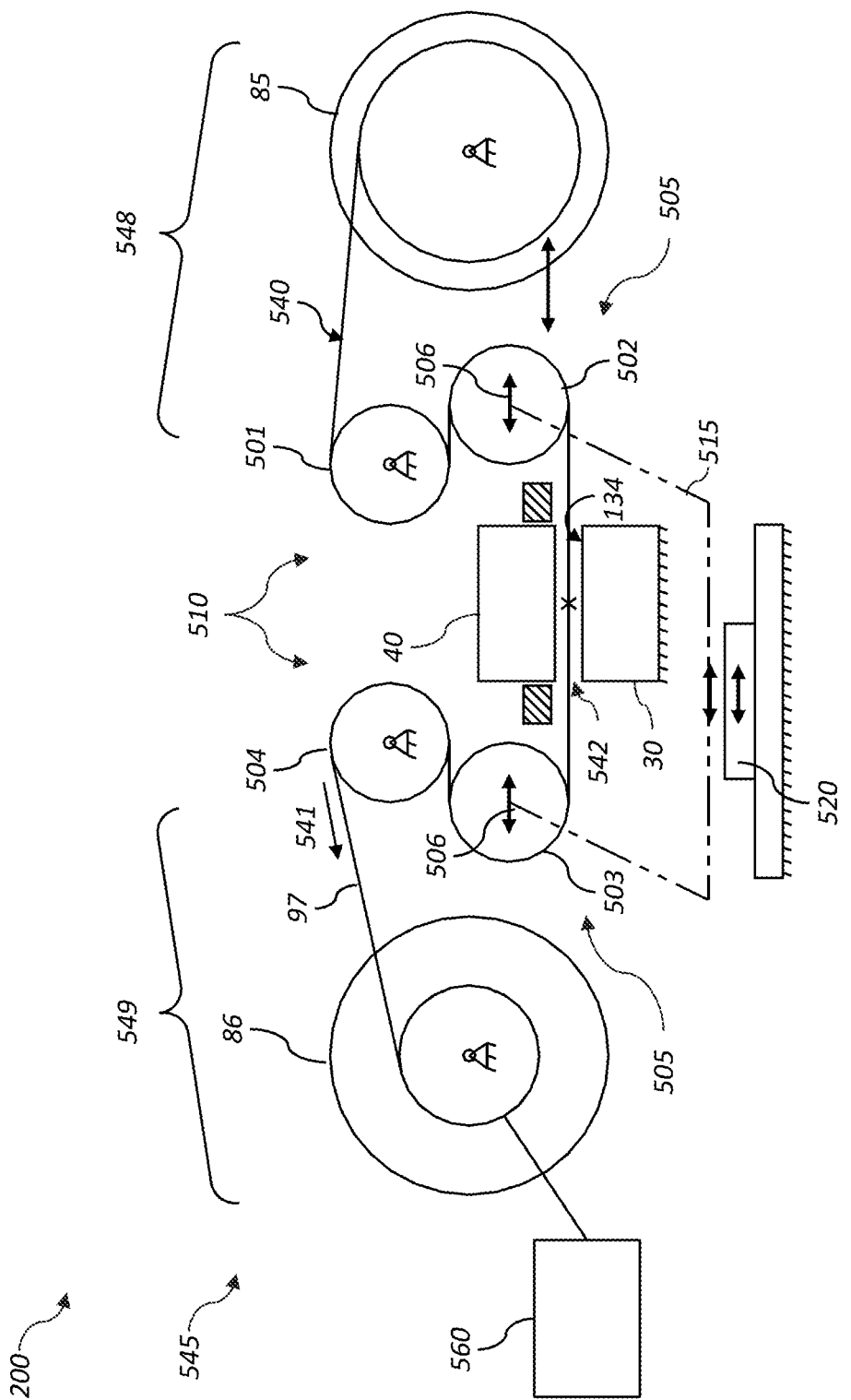
FIG. 4 is a cross-sectional view of a roll-to-roll thin film deposition system including a web transport system having an independently moveable portion in accordance with an exemplary embodiment.

FIG. 4 illustrates an SALD system 200 for depositing a thin film of material on a web of substrate 97 being transported along from upstream to downstream along a web transport path 540 from a supply roll 85 to a take-up roll 86 by a web transport system 545. The web transport system 545 include a fixed portion 510 including fixed-position web guides 501, 504, and a moveable portion 505 including moveable-position web guides 502, 503. The position of the moveable portion 505 can be controlled to control the motion of a portion of the web of substrate 97 independently of the overall motion of the web of substrate 97 through the web transport system 545. The moveable portion 505 of the web-transport system 545 can also be referred to as the "independent motion control portion," as the "independent motion portion" or as the "independent motion section," and it should be understood that these terms are equivalent.

As illustrated, the web transport system 545 with the moveable portion 505 is used in an SALD system 200. The illustrated SALE) system 200 includes a deposition head 30 and a gas-hearing backer 40. Additional details about exemplary gas-bearing backers 40 that can be used in accordance with the present invention are described in commonly-assigned, co-pending U.S. patent application Ser. No. 15/458,262 to Spath et al., entitled "Substrate positioning system with high-stiffness and low-stiffness gas bearings," which is incorporated herein by reference. It should be understood that the web transport system of the present invention is also useful in other types of SALD deposition systems, as well as in other types of web treatment systems where independent motion of the web of substrate 97 in a process region is desirable.

The web transport path 540 directs the web of substrate 97 from the supply roll 85, around the first fixed-position web guide 501, around the first moveable-position web guide 502, around the second moveable-position web guide 503, around the second fixed position web guide 504, and then to the take-up roll 86. It should be understood that the web transport system 545 can also include additional web guides and other web-transport system components (e.g., web-steering components and web tension sensing/control components) that are not shown in FIG. 4. Any useful web-transport system components known in the art can be used in accordance with the present invention.

In the illustrated embodiment, the fixed-position web guides 501, 504 and the moveable-position web guides 502, 503 are shown as rollers which rotate around a roller axis. In other embodiments, other types of web-guides can alternatively be used, such as non-rotating rollers or gas-bearing turn bars (sometimes referred to as air shoes). Any appropriate type of web guide known in the art can be used in accordance with the present invention as long as they provide a web transport path 540 having the required attributes. Preferably the web guides include convex exterior surfaces around which the web of substrate 97 passes. For configurations where one or more of the web guides are air shoes, the convex exterior surface of the web guide includes one or more openings through which a gaseous material is supplied to lift the web of substrate 97 away from the convex exterior surface.

The first fixed-position web guide 501 and the first moveable-position web guide 502 are positioned such that the tangent line between the bottom of first fixed-position web guide 501 and the top of moveable-position web guide 502 is parallel to the output face 134 of the deposition head 30. Similarly, the second fixed-position web guide 504 and the second moveable-position web guide 503 are positioned such that a tangent line between the top of the second moveable-position web guide 503 and the bottom of second fixed-position web guide 504 is also parallel to the output face 134 of the deposition head 30. Additionally, the first moveable-position web guide 502 and the second moveable-position web guide 503 are positioned such that a tangent line between the bottom of the first moveable-position web guide 502 and the bottom of the second moveable-position web guide 503 is also parallel to the output face 134 of the deposition head 30.

A web transport control system 560 enables steady movement of the web of substrate 97 along the web transport path 540 from the supply roll 85 to the take-up roll 86 in the in-track direction 541. For many applications, the web transport control system 560 will advance the web of substrate 97 at a substantially constant web advance velocity while coating a region of the web of substrate 97. Within the context of the present disclosure, "substantially constant" means constant to within 10%. The moveable portion 505 is independently controllable to enable an independent motion component which is superimposed on the continuous motion. This provides a composite motion profile for the process-portion of the web of substrate 97 as it moves past the deposition head 30, In a preferred embodiment, the moveable portion 505 is moved backward and forward such that the web of substrate 97 moves past the deposition head 30 in an oscillating motion while the global continuous motion moves the web of substrate 97 from the supply roll 85 to the take-up roll 86 continues in an uninterrupted fashion. This enables a motion profile such as the "ooching" motion profile described in commonly-assigned, co-pending U.S. patent application Ser. No. 15/458,287 to Spath et al., entitled "Deposition system with repeating motion profile," which is incorporated herein by reference. Such motion profiles are useful for performing SALD deposition on substrates that are larger than the deposition head, and include a repeating motion profile having a forward motion portion (toward the take-up roll 86) and a slightly smaller backward motion portion (toward the supply roll 85), providing a net forward motion of $\Delta x$, which can be referred to as an "ooch distance". In this case the basic forward and backward motion is provided by the oscillatory motion of the moveable portion 505, while the net forward motion $\Delta x$ results from the continuous web motion controlled by the web transport control system 560, and corresponds to the distance that the web of substrate 97 travels along web transport path 540 during the time it takes for the moveable portion 505 to complete one cycle.

The first fixed-position web guide 501 and the second fixed-position web guide 504 each have a fixed position relative to the machine base (ground). The moveable-position web guides 502, 503 are configured to move in unison in a motion direction 506 parallel to the output face 134 of the deposition head 30, while maintaining a constant distance between them. In the illustrated embodiment, this is accomplished by attaching the roller axes of the moveable-position web guides 502, 503 to a common rigid carriage 515 (shown schematically in FIG. 4) which is moveable in a motion direction 506 parallel to the output face 134 of the deposition head 30. The rigid carriage 515 is attached to a motion actuator 520 that moves the rigid carriage 515 forward and backward in an oscillating motion pattern, thereby synchronously moving the moveable-position web guides 502, 503 in unison. In alternative embodiments, the moveable-position web guides 502 and 503 can both be individually mounted to the motion actuator 520, or can be mounted to separate motion actuator systems that are controlled in synchronization.

The moveable-position web guides 502, 503 are arranged such the web transport path 540 travels between the moveable-position web guides 502, 503 in a plane parallel to the output face 134 of the deposition head 30. In the illustrated configuration, this is accomplished by positioning the roller axes of the moveable-position web guides 502, 503 in a plane that is parallel to the output face 134.

The portion of the web transport path 540 prior to the first moveable-position web guide 502 (in this case, the portion including the supply roll 85 and the first fixed position web guide 501) can be referred to as an entrance portion 548. Similarly, the portion of the web transport path 540 following to the second moveable-position web guide 503 (in this case, the portion including the second fixed position web guide 504 and the take-up roll 86) can be referred to as an exit portion 549.

Figure 5:
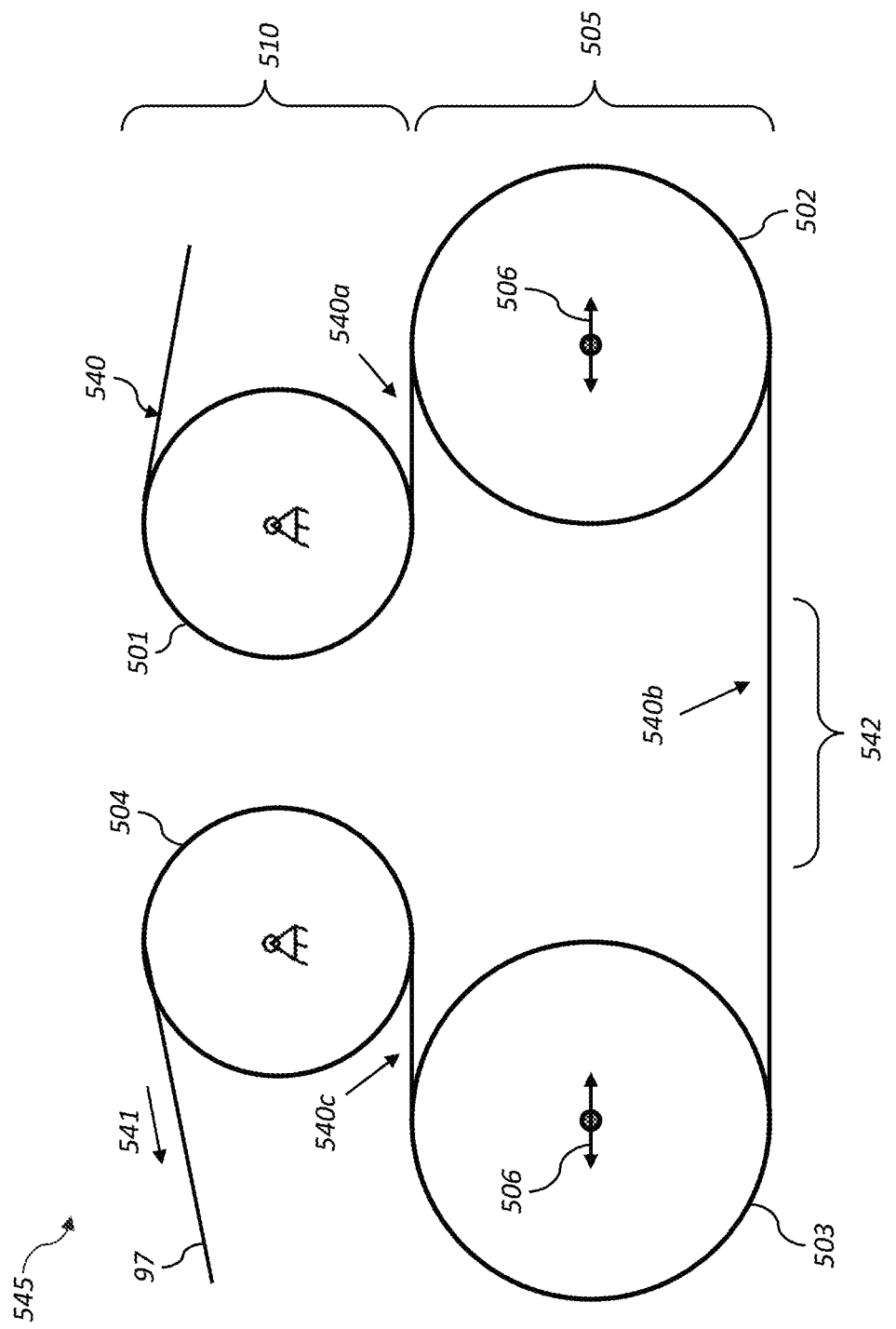
FIG. 5 is an expanded view of the web transport path through the independently moveable portion of the web transport system of FIG. 4.

FIG. 5 is an expanded view of a portion of the web transport path 540 of FIG. 4 including the moveable portion 505. The web of substrate 97 passes around the first fixed-position web guide 501 with an arbitrary wrap angle, for example between 90-225 degrees. The web of substrate 97 leaving the first fixed-position web guide 501 is then wrapped in the opposite direction around the first moveable-position web guide 502 with a wrap angle that is substantially equal to 180 degrees (i.e., equal to within ±10 degrees, and more preferably to within ±5 degrees). The wrapping of the web by 180 degrees around the first moveable-position web guide 502 forms two parallel web transport path portions 540a, 540b. The web of substrate 97 then passes through a process region 542, for instance a coating station. In an exemplary embodiment, the web is transported over an SALD deposition head 30 in the process region, which is mounted in a fixed position (see FIG. 4). In preferred embodiments, the output face 134 of the deposition head 30 and the web transport path portion 540b in the process region 542 are parallel. The web of substrate is then wrapped around the second moveable-position web guide 503 with a wrap angle that is nominally 180 degrees so that web transport path portion 540c between the second moveable-position web guide 503 and the second fixed-position web guide 504 is parallel to the other two web transport path portions 540a and 540b and to the output face 134 of the deposition head 30, and also to the motion direction 506. The web of substrate 97 passes around the second fixed-position web guide 504 with an arbitrary wrap angle, for example between 90-225 degrees. The web of substrate 97 exits the second fixed-position web guide 504 at a velocity equal to the incoming velocity at the first fixed-position web guide 501.

Figure 6:
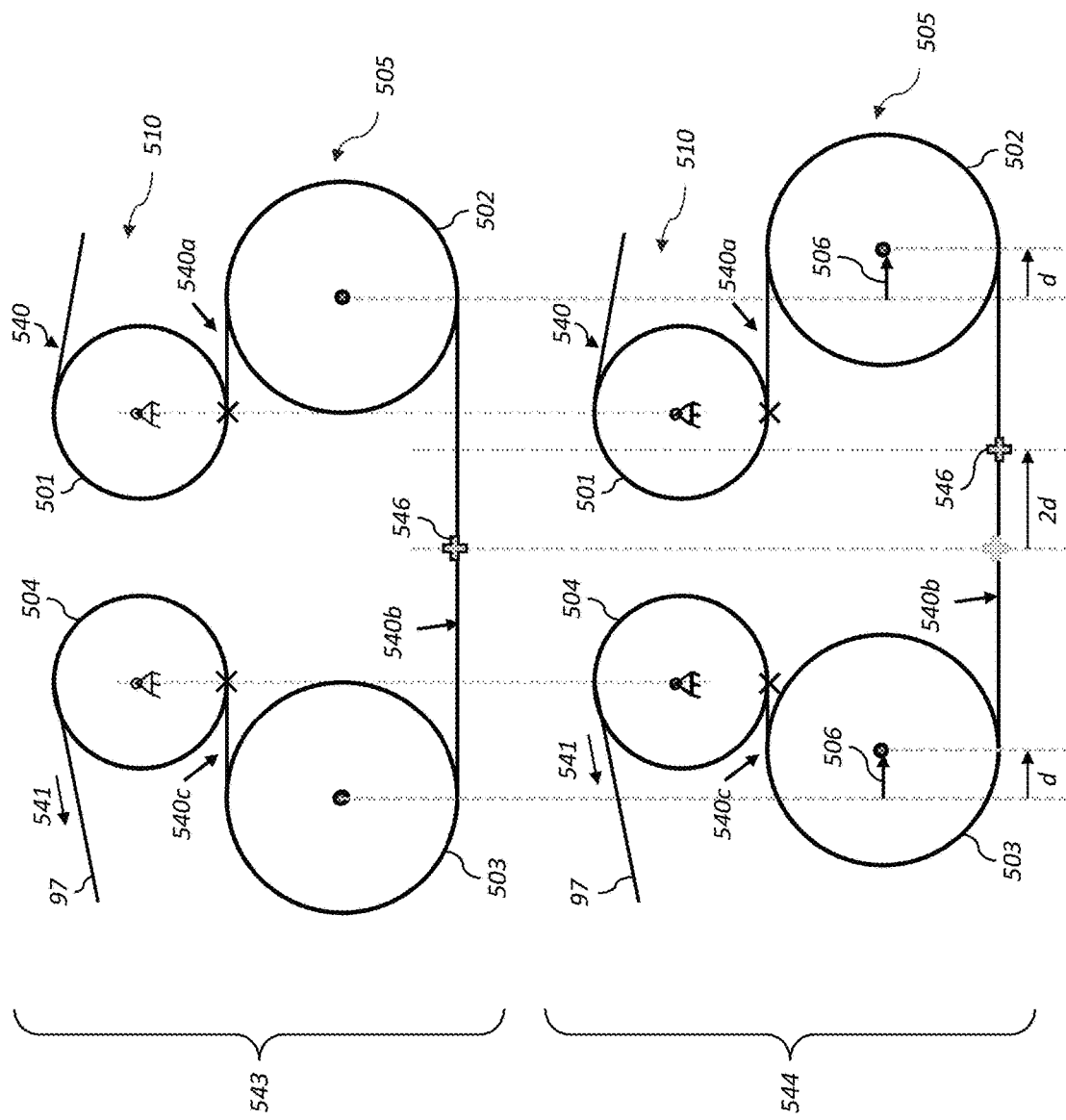
FIG. 6 illustrates the movement of the moveable portion of the web transport system and the corresponding displacement of the web of substrate.

Independent of motion of the web of substrate 97 through the fixed portion 510 of the web transport path 540, an oscillating, or reciprocating, motion component can be imparted to the web of media 97 along the web transport path portion 540b between the tangent points of moveable-position web guides 502, 503 by causing the moveable portion 505 to be displaced in a motion direction 506 parallel to the local web path (i.e., parallel to the output face 134 of the deposition head 30), for example by displacing the commonly-attached rigid carriage 515 using the motion actuator 520. To understand the relative displacement distances, consider the case where the web of substrate 97 is not advanced along the web path such that it is held stationary on the circumference of fixed-position web guide 501. FIG. 6 illustrates moving the moveable portion 505 a distance d to the right from a first position 543 to a second position 544. It can be seen that an equal amount of the web of substrate 97 is paid out by the moveable-position web guide 503 and taken up by the other moveable-position web guide 502, thus the total length of the web transport path 540 is maintained between the fixed-position web guides 501, 504. It can also be seen that a substrate point 546 on the web of substrate 97 along the web transport path portion 540b between moveable-position web guides 502, 503 will be displaced by a distance twice that of the carriage displacement (i.e., 2d).

Further considering the case where the web of substrate 97 is held stationary, it will be effectively pinned at the tangent point on fixed-position web guide 501 marked by an "x." At the instant that the moveable-position web guide 502 moves by an infinitesimal amount (driven by the motion actuator 520 (FIG. 4)), the point of the web at the 12 o'clock position of moveable-position web guide 502 is the instant center (i.e., pivot point) of a virtual lever extending from the 12 o'clock position of the moveable-position web guide 502, through the center of the moveable-position web guide 502, and to the 6 o'clock position of the moveable-position web guide 502. The point on the moveable-position web guide 502 at 6 o'clock, being a distance one diameter, or twice the radius of the moveable-position web guide 502 away from the instant center, moves twice as far as the moveable-position web guide 502 center point, which is only a distance of one radius away from the instant center. According to the principles of mechanical dynamics, when the infinitesimal displacements of the moveable-position web guide 502 center accumulate by the distance d, a substrate point 546 on the inextensible web (e.g., "+", tangent to the roller at 6 o'clock, will have been displaced by 2d. In order for this relationship to hold true, the three web transport path portion 540a, 540b, 540c of the independent motion must be substantially parallel. Within the context of the present disclosure, substantially parallel means parallel to within 10°.

Likewise, the instantaneous velocity and linear acceleration of the web of substrate 97 in the process region 542 is twice that of the carriage 515 (FIG. 4) due to the doubling of displacement over the same amount of time (if a function is multiplied by a scalar constant then its derivatives are also multiplied by the same constant). An advantage of the embodiment of the present invention shown in FIGS. 4-6 is that the linear acceleration of the web takes place in the plane of the web making out of plane flutter negligible, and any rotational acceleration takes place where the web is radially supported, such as on the surfaces of the moveable-position web guides 502, 503. During typical operation, after some displacement distance, the direction of motion of carriage 515 will be reversed, causing the web of substrate 97 to accelerate and travel in the opposite direction. If the carriage position is moved in a cyclical manner, an oscillatory component of velocity will be superposed with any continuous velocity component of the web of substrate exiting at fixed-position web guide 501. Stated another way, the oscillatory component of the velocity is only present in the portion of web of substrate 97 is between the 12 o'clock position of moveable-position web guide 502 and the 12 o'clock position of moveable-position web guide 503; this portion of the web of substrate 97 can be referred to as the "independent web motion portion."

Figure 7:
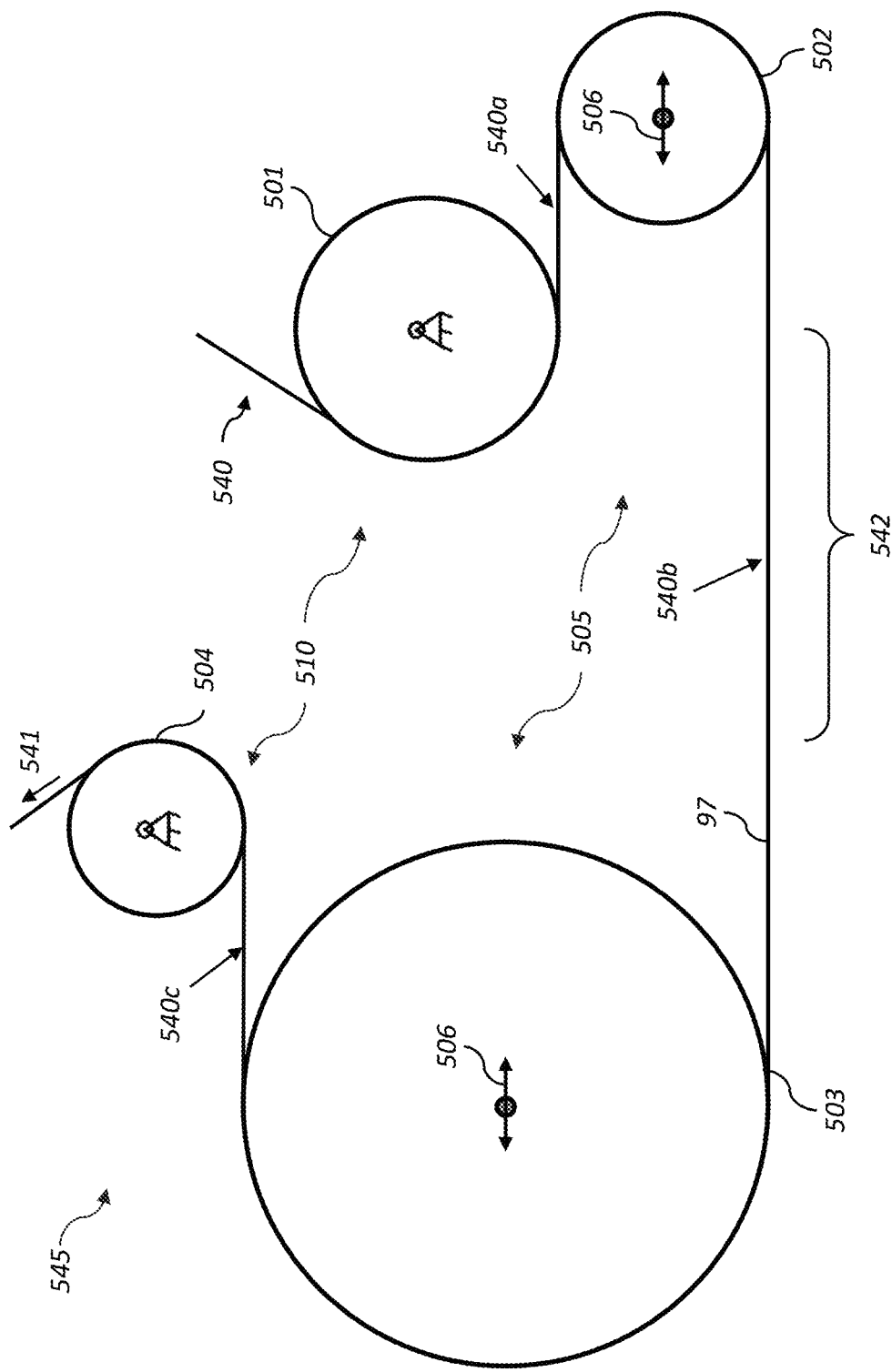
FIG. 7 illustrates an alternate configuration of the moveable portion of the web transport system in accordance with exemplary embodiments.
Figure 8:
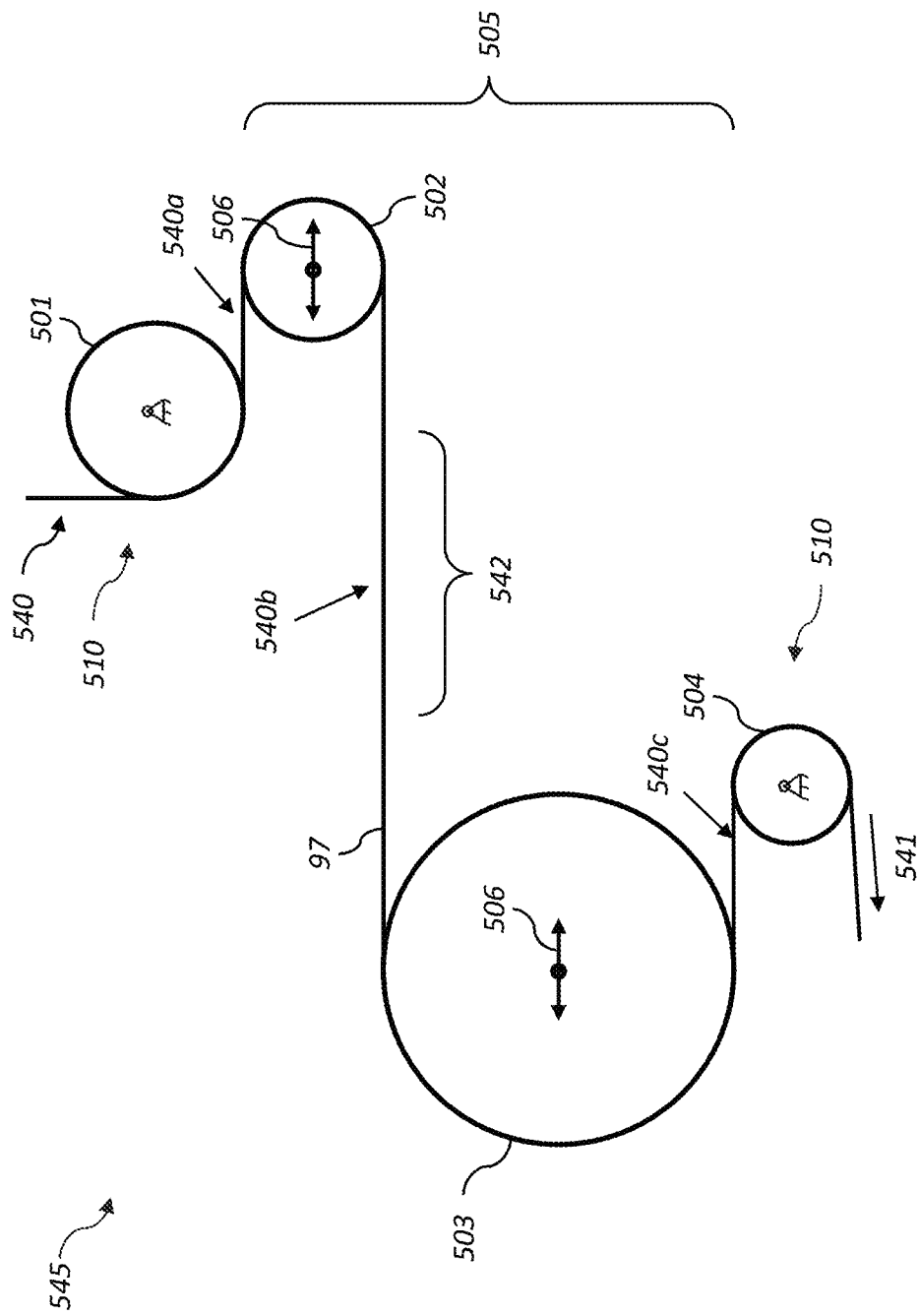
FIG. 8 illustrates an alternate configuration of the moveable portion of the web transport system in accordance with exemplary embodiments.

Moveable-position web guides 502, 503 need not be similarly sized, have a common shape, or be positioned on a common side of the web. FIGS. 7-11 illustrate alternative embodiments of the moveable-position web guides 502, 503 of the independent motion control portion of the present invention. In the embodiment of FIG. 7, the second moveable-position web guide 503 is significantly larger than the first moveable-position web guide 502. In some uses, the arrangement may provide less stress on the processed web as it immediately exits the process section. It is worth noting that fixed-position web guide 501, 504 can also be of varying size and position, as illustrated. The moveable portion 505 operates in the same manner as previously described, and meets the requirement that the web transport path portions 540a, 540b, 540c are parallel to each other and to the motion direction 506. In FIG. 8, the second moveable-position web guide 503 has been arranged to be on the side of the web of substrate 97 opposite to the first moveable-position web guide 502. Again the three web transport path portions 540a, 540b, 540c are maintained to be parallel to each other and to the motion direction 506.

Figure 9:
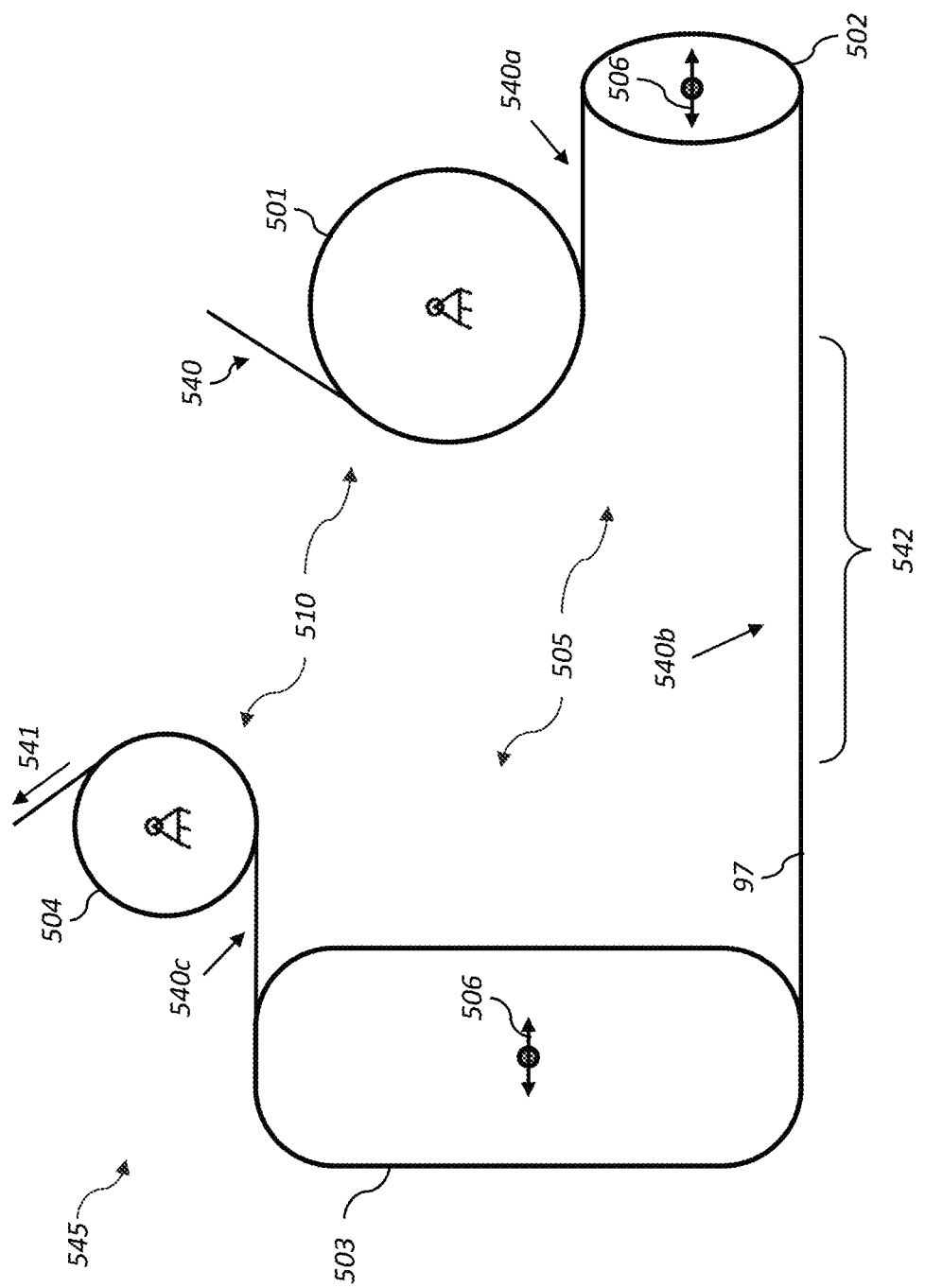
FIG. 9 illustrates an alternate configuration of the moveable portion of the web transport system in accordance with exemplary embodiments.

FIG. 9 illustrates that the moveable-position web guides 502, 503 may have any arbitrary shape so long as provide the necessary parallel characteristics of the web transport path portions 540a, 540b, 540c. In this case, moveable-position web guides 502, 503 are non-rotational elements such as air (or gas) bearing elements.

Figure 10:
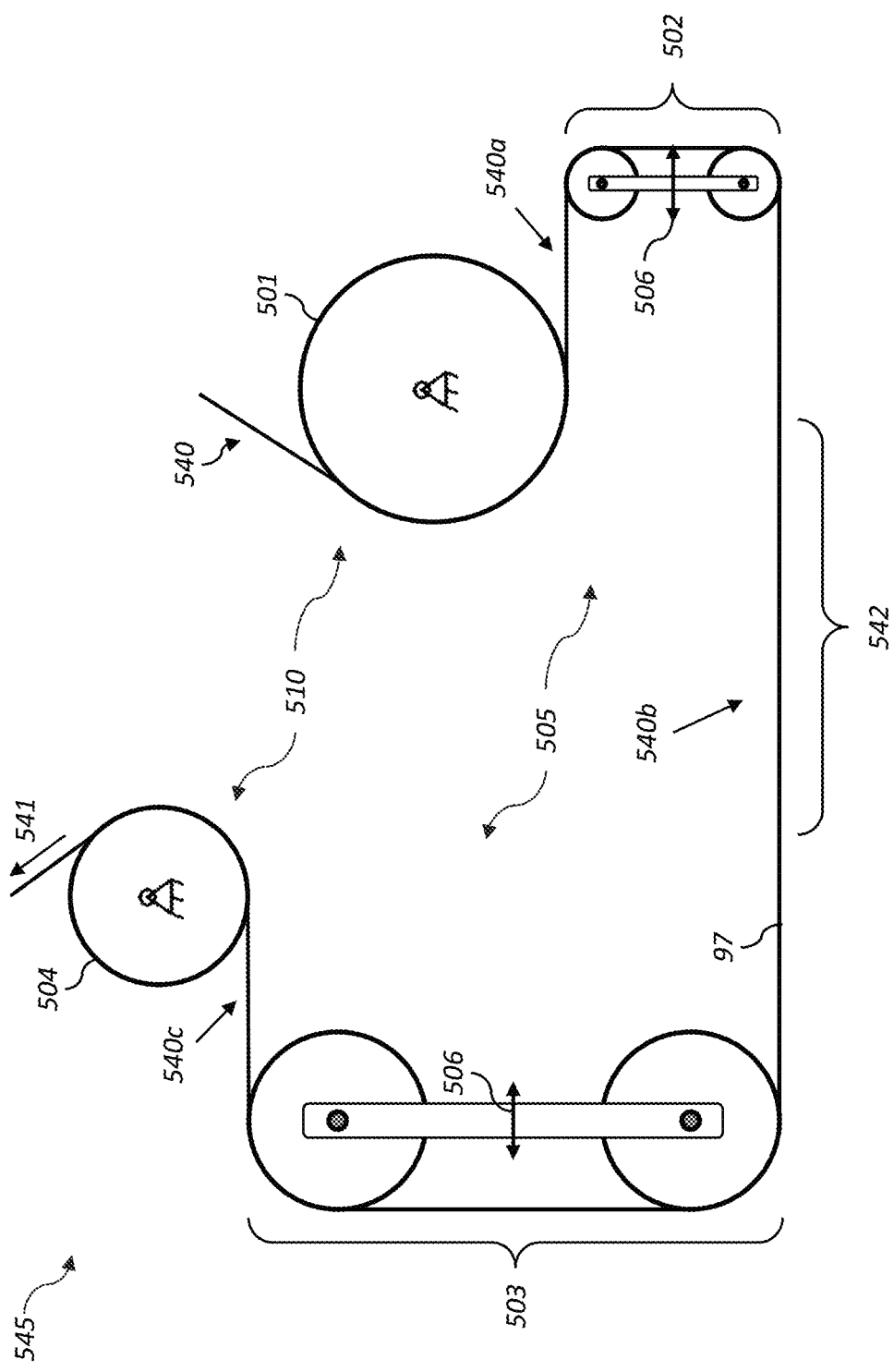
FIG. 10 illustrates an alternate configuration of the moveable portion of the web transport system in accordance with exemplary embodiments.

FIG. 10 illustrates an exemplary configuration where the moveable-position web guides 502, 503 are web guide units that include a plurality of individual web guides. The web guide units move together as a unit. Either by mounting them onto a common structure as illustrated, or by controlling their position in synchronization. The total wrap angle around each of the moveable-position web guide units 502, 503 is 180 degrees so that the web of substrate 97 enters and exits the moveable-position web guide units 502, 503 in web travel directions that are substantially parallel to each other, and also to the motion direction 506 of the moveable portion 505. Another way to say this is that the web transport path portions 540a, 540b, 540c are all parallel to each other and to the motion direction 506.

Figure 11:
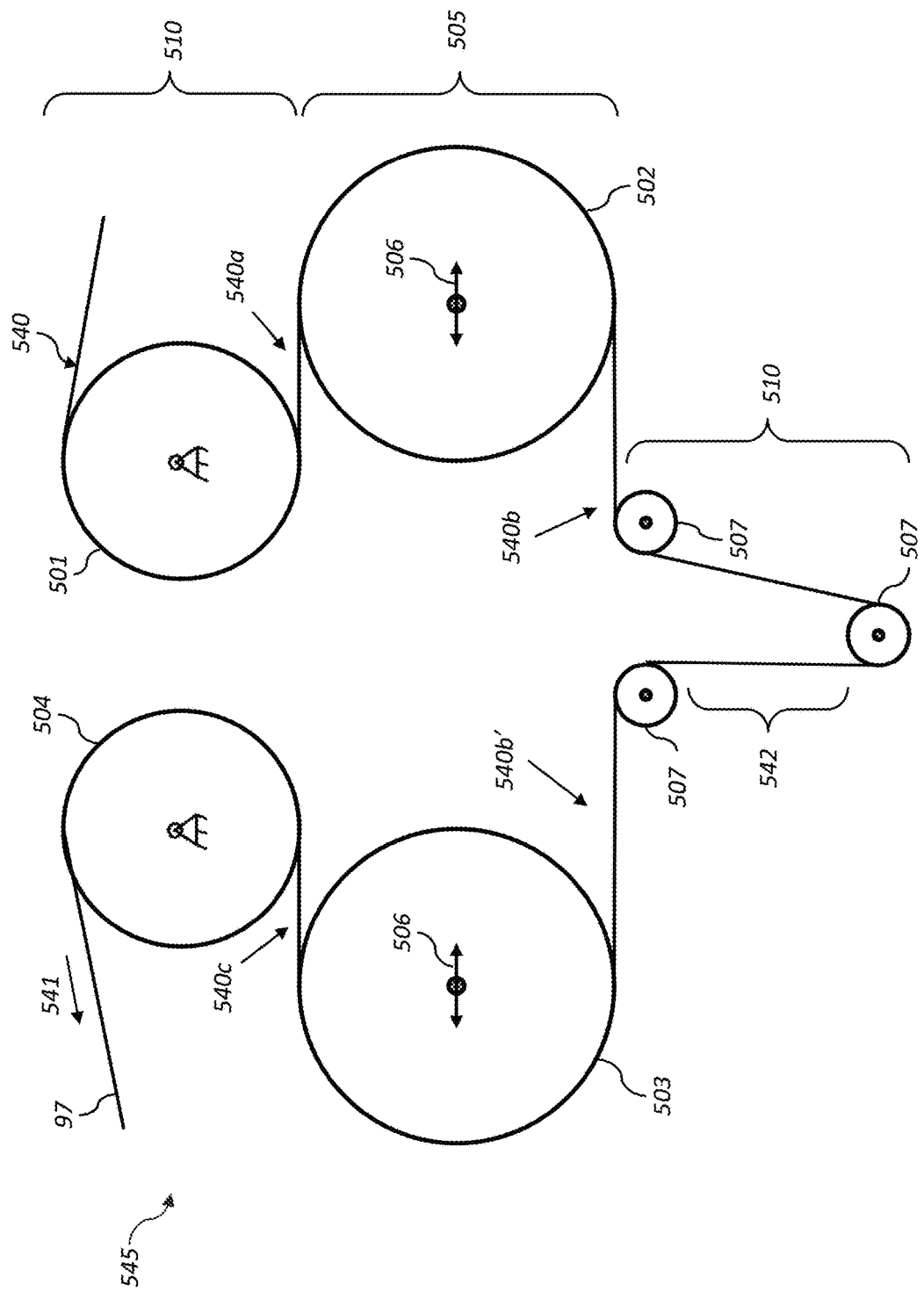
FIG. 11 illustrates an alternate configuration of the moveable portion of the web transport system in accordance with exemplary embodiments.

In the preceding examples, the motion direction 506 of the moveable portion 505 is parallel to web transport path 540 in the process region 542. Accordingly, the motion direction 506 is also parallel to the output face 134 of the deposition head 30 (see FIG. 1). However, this is not a requirement. FIG. 11 illustrates an exemplary configuration where additional fixed-position web guides 507 are included along the web transport path 540 between the first and second moveable-position web guides 502, 503 to redirect the direction of web travel to provide a vertically oriented process region 542. The fixed-position web guides 507 can be considered to be components of the fixed portion 510 of the web transport system 545. As with the previously discussed configurations, the total wrap angle around each of the moveable-position web guide 502, 503 is 180° so that the web of substrate 97 enters and exits the moveable-position web guide units 502, 503 in web travel directions that are substantially parallel to each other, and also to the motion direction 506 of the moveable portion 505. Another way to say this is that the web transport path portions 540a, 540b, 540b', 540c are all parallel to each other and to the motion direction 506.

Returning to FIG. 4, oscillatory motion of the carriage 515 may be imparted by any convenient type of motion actuator 520 mechanism familiar to one skilled in the art. Examples of applicable motion actuators 520 include slider-crank, four-bar linkage, cam, pneumatic actuators, hydraulic actuators, lead screw/motor and other electro-magnetic actuators (e.g., voice-coils, solenoids). Suspension and guidance of the carriage 515 may be accomplished by plain bearing sliding ways comprised of appropriately surface treated metals or polymers, ball or crossed roller slides, gas bearings, or other way systems known to one schooled in mechanical design. The short stroke of the carriage 515 is also compatible with flexure suspension. In one exemplary embodiment, a stepper or servo motor driven lead screw with the lead nut coupled to the carriage 515 is employed. In another exemplary embodiment the carriage 515 is combined with the moving portion of a brushless linear motor, either as a payload, or more preferably as an integrated unit.

Embodiments using independent mechanisms for moving the axes of moveable-position web guides 502, 503 in matching displacements, include but are not limited to independent motors and lead screws programmed identically. Such configurations fulfill the functional intent of the rigid carriage 515 mounted to a common actuator 520 and are considered equivalent. In some embodiments, one or both of the moveable-position web guides 502, 503 can have a heat transfer functionality contributing to raising the temperature of the web of substrate 97 to the process temperature or cooling the web of substrate 97 after processing.

In some embodiments, moveable-position web guides 502, 503 are low polar moment of inertia rollers including thin tubular shells supported by low friction bearings, for example ball bearings. In alternative embodiments, rotary gas bearing supported thin shell rollers (e.g., PNEU-ROLL Air Bearing Separator Rolls available from Parts & Systems Company, Inc. of Asheville, N.C.) are used for the moveable-position web guides 502, 503 to provide low inertia/low friction web support. In other embodiments, the fixed-position web guides 501, 504 and moveable-position web guides 502, 503 are non-rotating turn bars which use direct gas (fluid) to support and turn the web along the web path (e.g., Air Turns available from New Way Air Bearings of Aston, Pa.). Embodiments using non-rotating turn bars are advantaged due to the lack of inertial influence from the web turning device, and corresponding lack of web tension perturbation as a result of acceleration. Additionally, there is no contact or potential damage or contamination of the web surface in non-rotating turn bar embodiments. In the case of gas bearing turn bars, the active bearing surface of moveable-position web guides 502, 503 may be reduced to only the arc segment in proximity to the web, nominally 180 degrees of wrap, providing additional compactness of the web path because the moveable-position web guides 502 and 503 can be brought in close proximity to the process region 542.

In some embodiments, one or both of the fixed-position web guides 501, 504 are used for speed sensing for the non-oscillatory velocity component of web motion since they have no particular inertial considerations. In other embodiments, one or both of the fixed-position web guides 501, 504 also have web tracking (i.e., in-plane steering) functionality. In yet other embodiments, one or both of the fixed-position web guides 501, 504 are used as part of a tension sensing system. The four roller arrangement illustrated in FIG. 4 is advantaged by having the areas above and below the process region unobstructed by the web transport path 540, thus providing freedom in design and mounting of components of the process region 542.

In addition to tensile strain resulting from steady-state web tension, the web of substrate 97 experiences strain due to bending. The bending strain is: $e=y/R$; where R is the radius of curvature and y is the distance from neutral axis of the substrate 97 at the location of interest, typically at the surface of the web. Thus y=web thickness/2, and R is approximately equal to the radius of the supporting roller or turning device for a thin web. To minimize bending strain one would use large rollers, however the inertia of a solid roller increases as $mass \times R^2$. Any rotational inertia will require torque to overcome, and will result in tension perturbations in the web. This can be largely overcome by the use of thin roller shells, and use of the smallest roller allowed by the material properties of the coating. As long as the wrap angle is maintained at nominally 180 degrees on each roller, it is not necessary that the rollers be the same diameter. The diameter of the outgoing roller (e.g., second moveable-position web guide 503) can be independently optimized to account for material property changes as a result of the deposited material or processing conditions applied in the coating section, as was illustrated in FIGS. 7-8.

Figure 12:
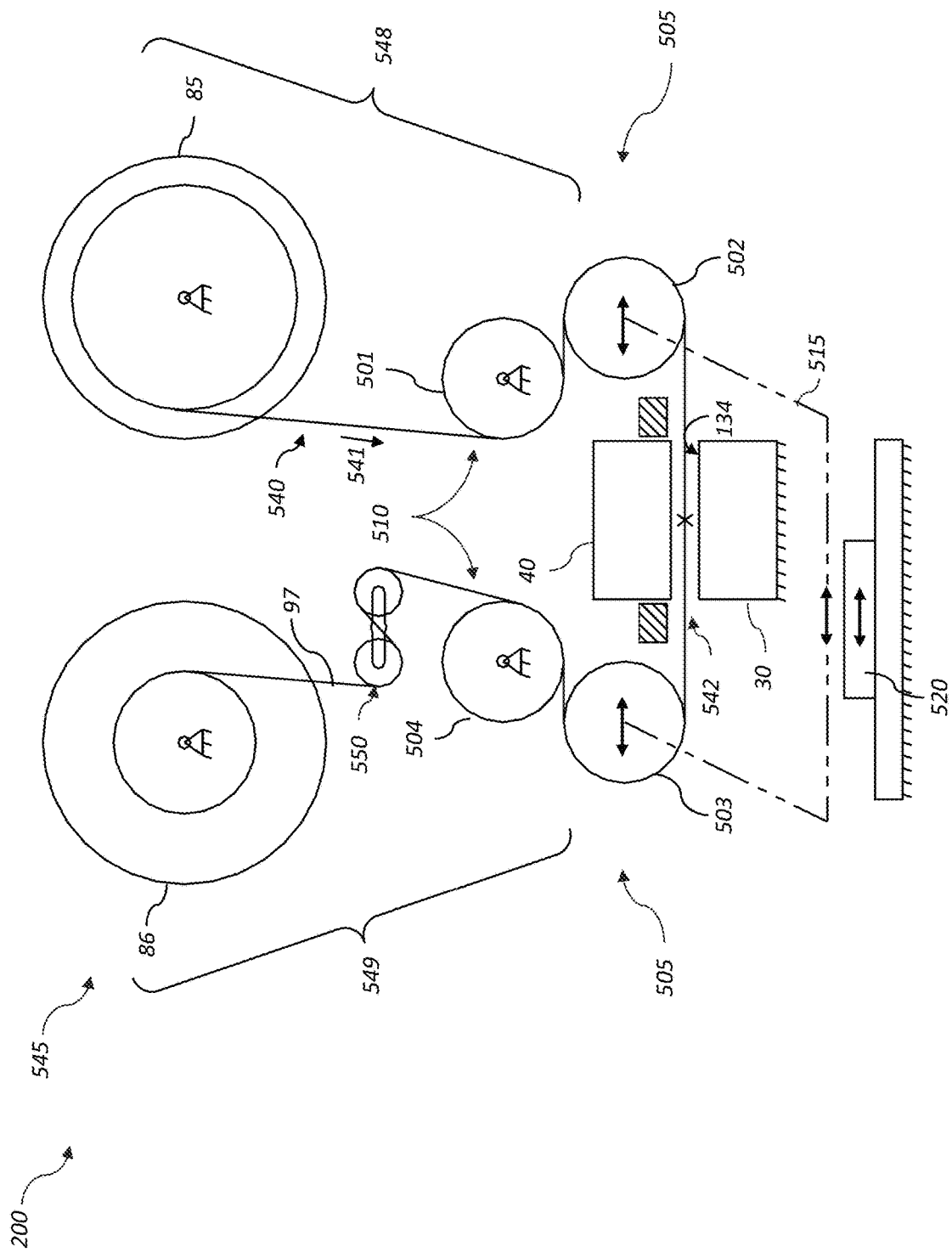
FIG. 12 is a cross-sectional view of a roll-to-roll thin film deposition system including a tension control component.

FIG. 12 illustrates the use of a tension control component 550 in the web transport path 540 of the web transport system 545 between the fixed-position web guide 504 and the take-up roll 86. As illustrated the web of substrate 97 is fed from right-to-left. In some embodiments, the control of the web feed velocity is set by the feed-roller and gauged on the first fixed-position web guide 501. The illustrated tension control component 550 is preferably a dancer roll assembly. In this arrangement it is preferred that torque control be imparted at the take-up roll 86, based on the tension signal from the dancer rollers. This configuration is advantaged when processing flexible polymeric webs where there are significant temperature considerations, with typical process conditions indicating that a nominally "cold" web will enter the process section and be heated, resulting in a web of elevated temperature leaving the process region 542 (which is potentially softer/more flexible). Depending on the types of webs of substrate 97 to be processed, and the process conditions to be utilized, tension, torque and velocity control can be configured to best suit the system requirement while using the motion control of the present invention. The remaining elements of FIG. 12 are the same as those in FIG. 4 and should be understood from the previous description.

Figure 13:
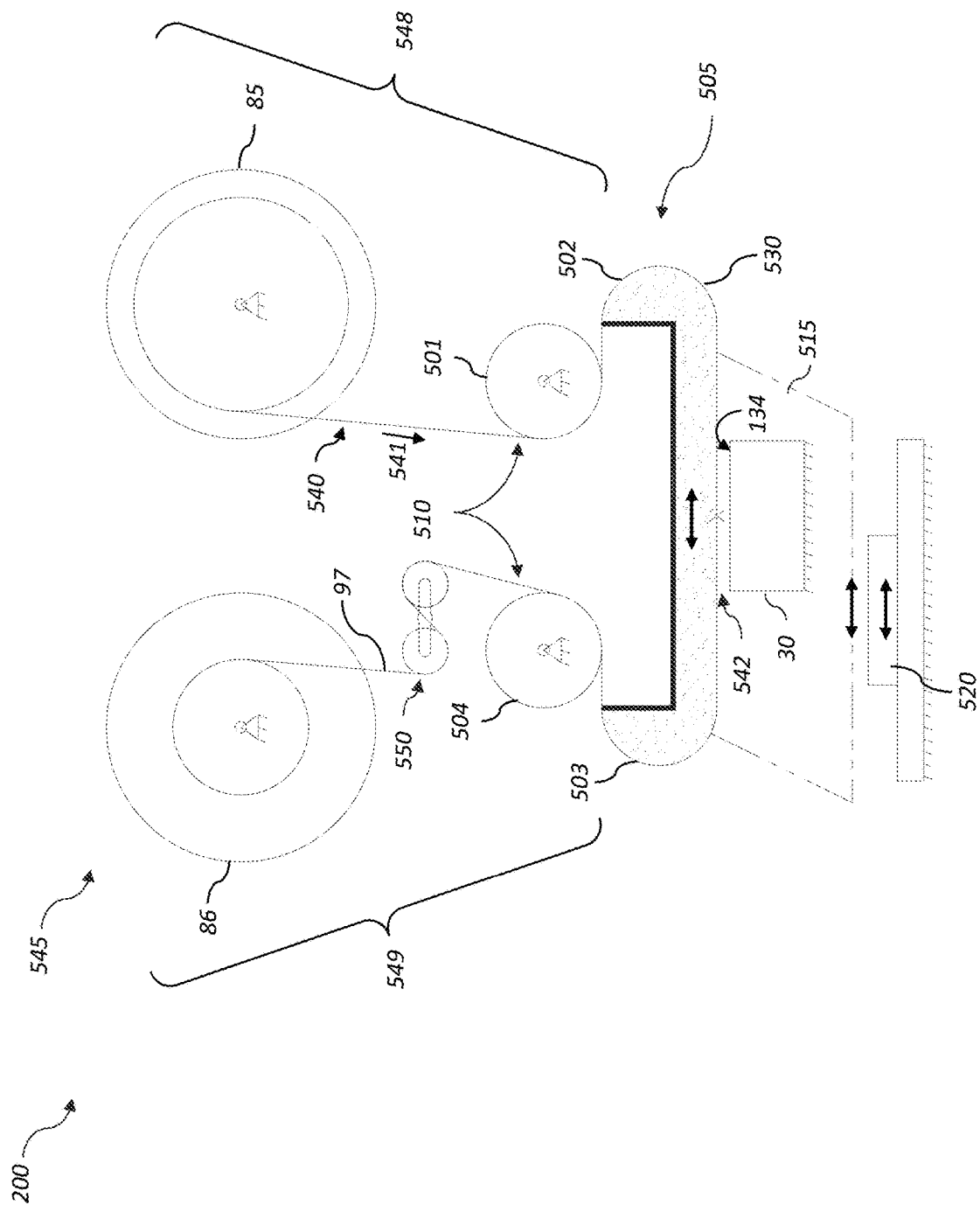
FIG. 13 is a cross-sectional view of an exemplary roll-to-roll thin film deposition system where the moveable-position web guides are combined into a single moveable structure.

In an alternative embodiment, shown in FIG. 13, the pair of separated moveable-position web guides 502, 503 are constructed as portions of a single monolithic moveable structure 530, for example, machined from a single block of porous material, such as graphite. In some embodiments, the moveable structure 530 acts as a gas bearing and includes a planar gas bearing surface that acts to support, locate, and flatten the web of substrate 97 in proximity to the stationary process components (e.g.: output face 134 of deposition head 30). Surfaces of the moveable structure 530 that do not interface with the web of substrate 97 may be sealed to prevent loss of internal pressure and reduce gas consumption. The moveable structure 530 may further include integral kinematic mounting features for attachment to the motion actuator 520, thus eliminating separate brackets having such features. In some embodiments, the moveable structure 530 has one or more pockets or apertures to provide clearance for relative motion with respect to stationary process components (e.g., deposition head 30 or gas-bearing backer 40) adjacent to the oscillating web of substrate and positioned between the axes of the moveable-position web guides 502, 503. It should be understood that although the moveable structure 530 is illustrated as symmetric, there is no requirement that the right-side of the moveable structure 530 and the left-side of the moveable structure 530 have the same profile, or radius of curvature. The remaining elements of FIG. 13 are the same as those in FIG. 12 and should be understood from the previous description.

Figure 14:
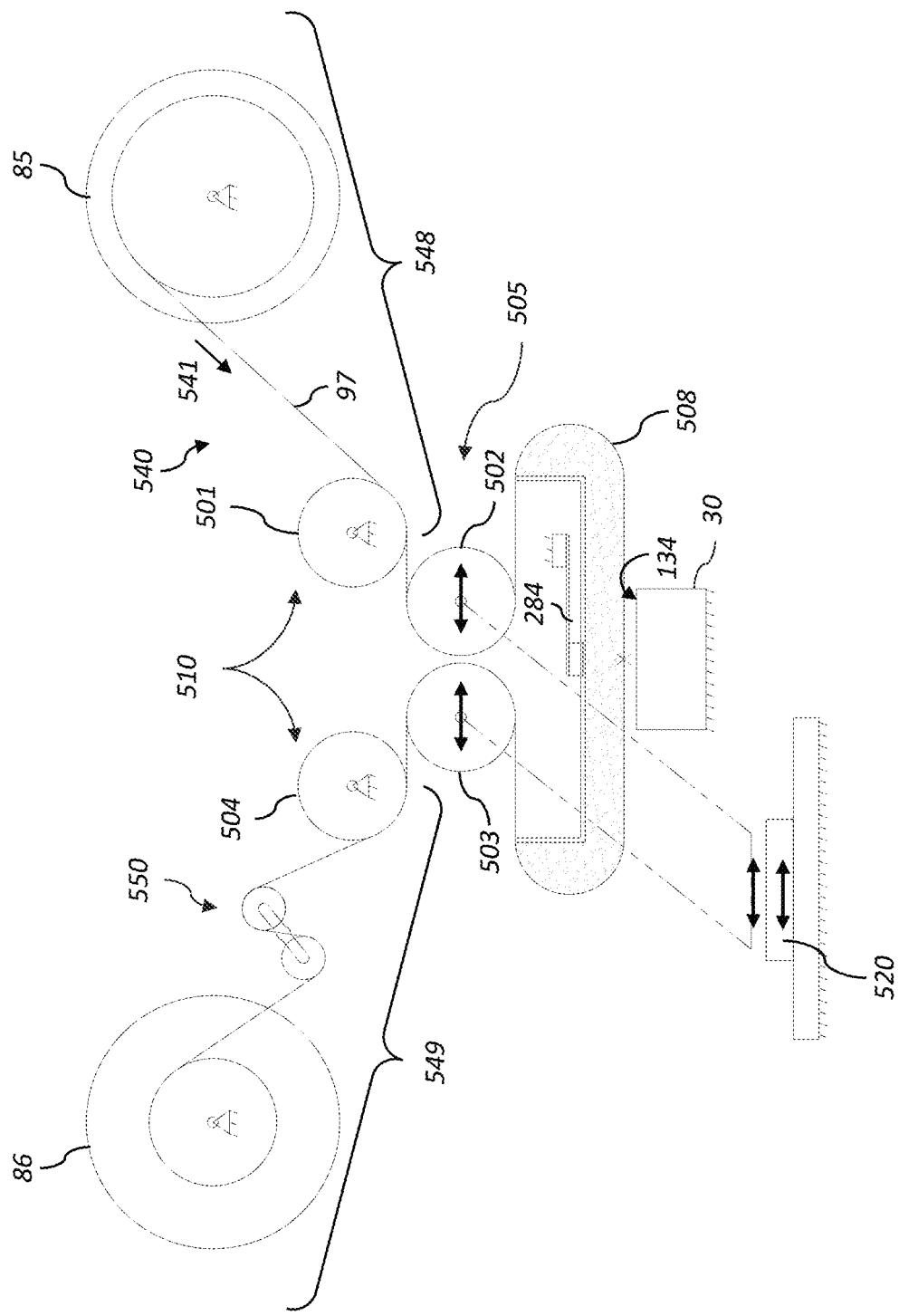
FIG. 14 is a cross-sectional view of exemplary roll-to-roll thin film deposition systems which include a web guide structure along the web transport path between the moveable-position web guides.
Figure 15:
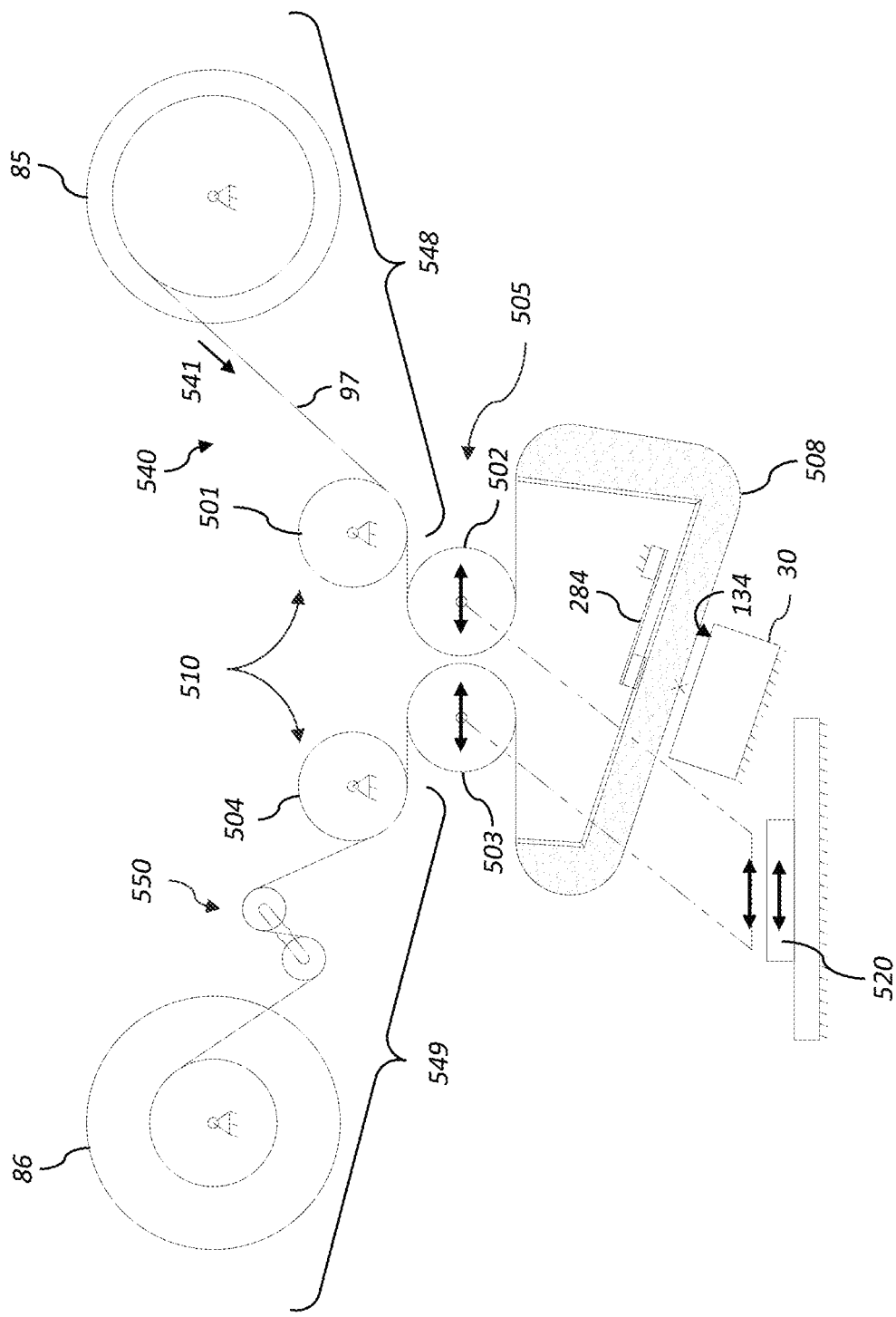
FIG. 15 is a cross-sectional view of exemplary roll-to-roll thin film deposition systems which include a web guide structure along the web transport path between the moveable-position web guides.

FIG. 14 illustrates another exemplary configuration wherein a web guide structure 508 is to redirect the web transport path 540 between the first and second moveable-position web guides 502, 503. In this example, the web guide structure 508 is a monolithic structure that is positioned on an opposite side of the web of substrate 97 from the deposition head 30. The web guide structure 508 serves as a backer for the deposition head 30, and is mounted on a flexure 284 that constrains the lateral position, while enabling it to move in a vertical direction. This configuration has the advantage that the moveable portion 505 will be farther removed from the deposition head 30 thereby reducing interference problems. FIG. 15 shows a variation of this configuration wherein the web guide structure 508 has a tilted surface which serves as the backer for the deposition head 30.

Figure 16:
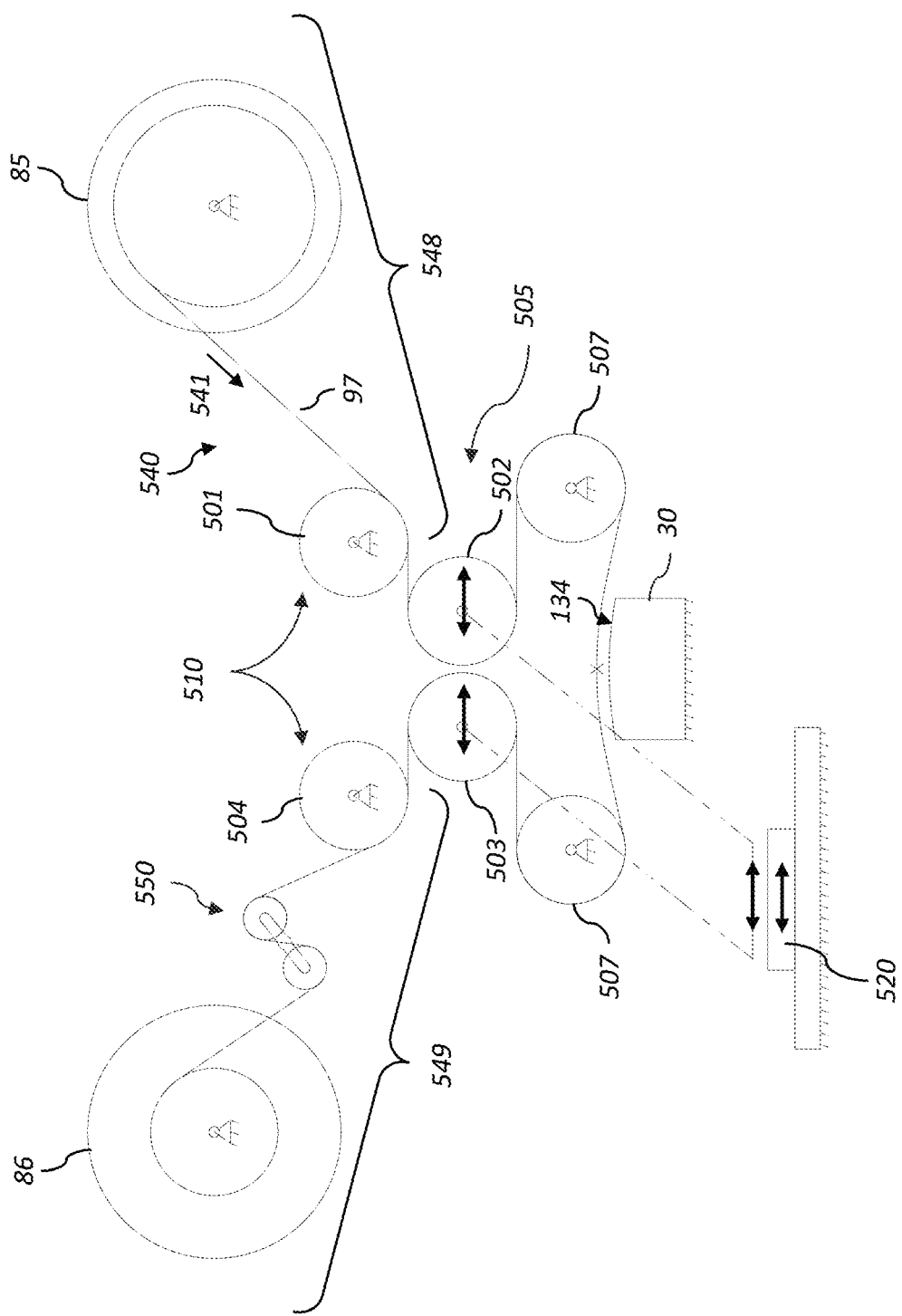
FIG. 16 is a cross-sectional view of an exemplary roll-to-roll thin film deposition system having a deposition head with a curved output face which includes a pair of fixed-position web guides along the web transport path between the moveable-position web guides.

FIG. 16 illustrates an exemplary configuration where a pair of fixed-position web guides 507 are used to redirect the web transport path 540 between the first and second moveable-position web guides 502, 503. The deposition head 30 in this case has a curved output face 134, and the web transport path 540 between the fixed-position web guides 507 follows a corresponding curved path.

Figure 17:
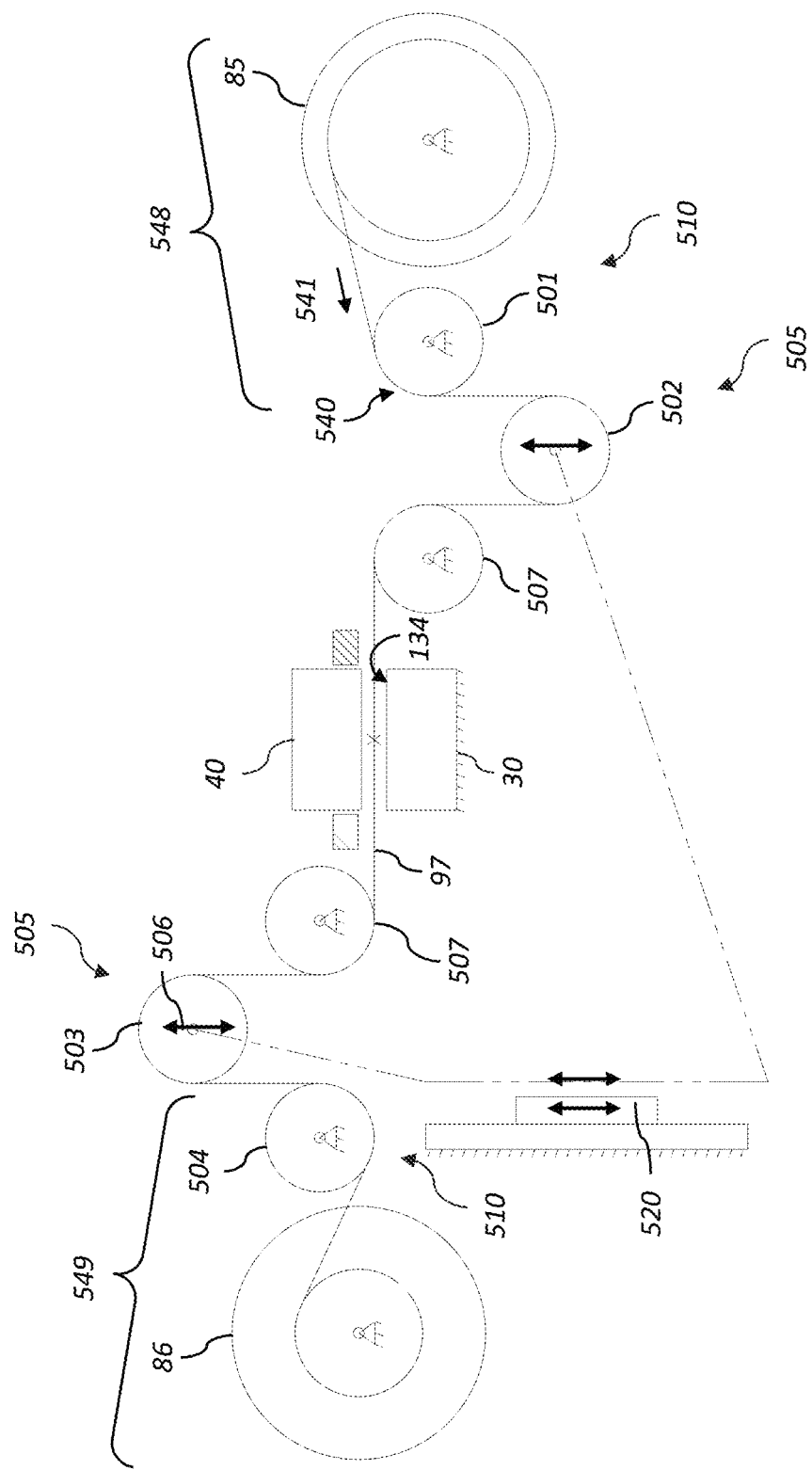
FIG. 17 is a cross-sectional view of an exemplary roll-to-roll thin film deposition system wherein the moveable portion moves in a vertical direction.

It is not required that the motion direction 506 for the moveable portion 505 be parallel to the output face 134 of the deposition head 30. FIG. 17 illustrates an exemplary configuration where the moveable-position web guides 502, 503 are moved in a vertical direction which is perpendicular to the output face 134 of the deposition head 30.

Figure 18:
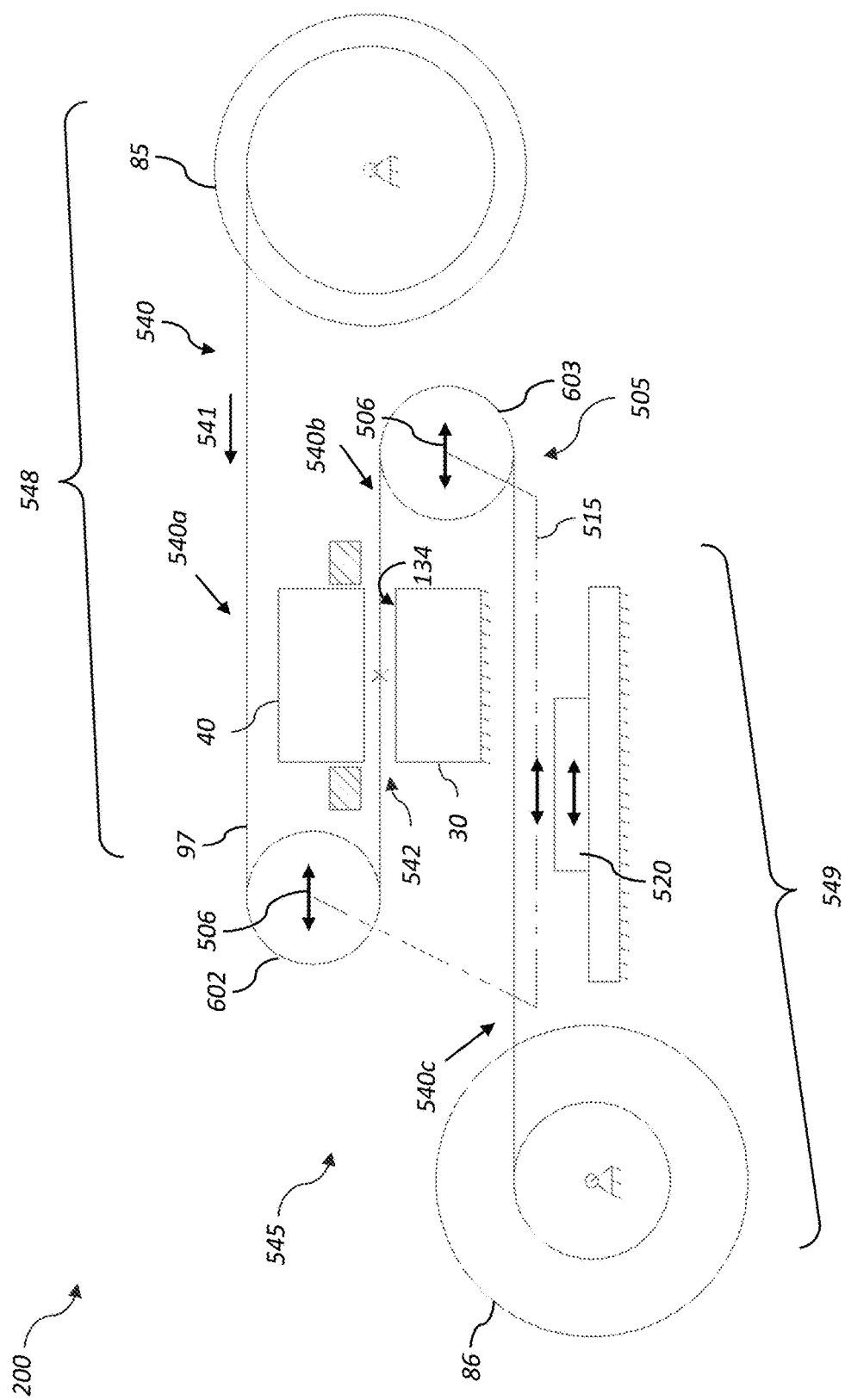
FIG. 18 is a cross-sectional view of a roll-to-roll thin film deposition system having a two-component implementation in accordance with an alternate embodiment.

In the two-component implementation illustrated in FIG. 18, the incoming web of substrate 97 is transported in a plane above (or below) the coating station to a moveable-position web guide 602 where it is wrapped with a wrap angle of nominally 180 degrees. The web of substrate 97 is then transported in the plane of the coating station, past the deposition head 30, and to a second moveable-position web guide 603. The web is wrapped 180 degrees around the second moveable-position web guide 603 and leaves the moveable portion 505 in a plane parallel to the original incoming plane and below (or above) the coating station. The axes of the moveable-position web guide 602, 603 are attached to a common carriage 515 that oscillates in a plane parallel to the tangent points of moveable-position web guide 602 and 603 and parallel to the output face 134 of the deposition head 30, and thus imparts an oscillatory velocity component to the web of substrate 97 in the process region 542. In this configuration, the entrance portion 548 and exit portion 549 don't include any web guides, and the supply roll 85 and the take-up roll 86 effectively serve the purpose of the fixed-position web guides 501, 504 in the previously described systems. This two-component arrangement is advantaged in having minimal components. The inertial aspects of the two- and four-component implementations of the independent motion control sections are equivalent.

Note that as the web of media 97 moves from the supply roll 85 and the take-up roll 86, the plane of the web of media 97 in web transport path portions 540a, 540b can change somewhat. Depending on the web travel distances, in some configuration this could cause the wrap angle around the moveable-position web guides 502, 503 to become significantly different than the specified 180° wrap angles. At some point, the change in the wrap angle can have a detrimental effect on the performance of the SALD system 200 (e.g., when the movement of the moveable portion 505 introduces significant perturbations in the web tension). In some arrangements, this affect can be mitigated by adjusting a vertical position of the supply roll 85 and the take-up roll 86 during operation of the SALD system 200 so that the web transport path portions 540a, 540b remain horizontal.

Figure 19:
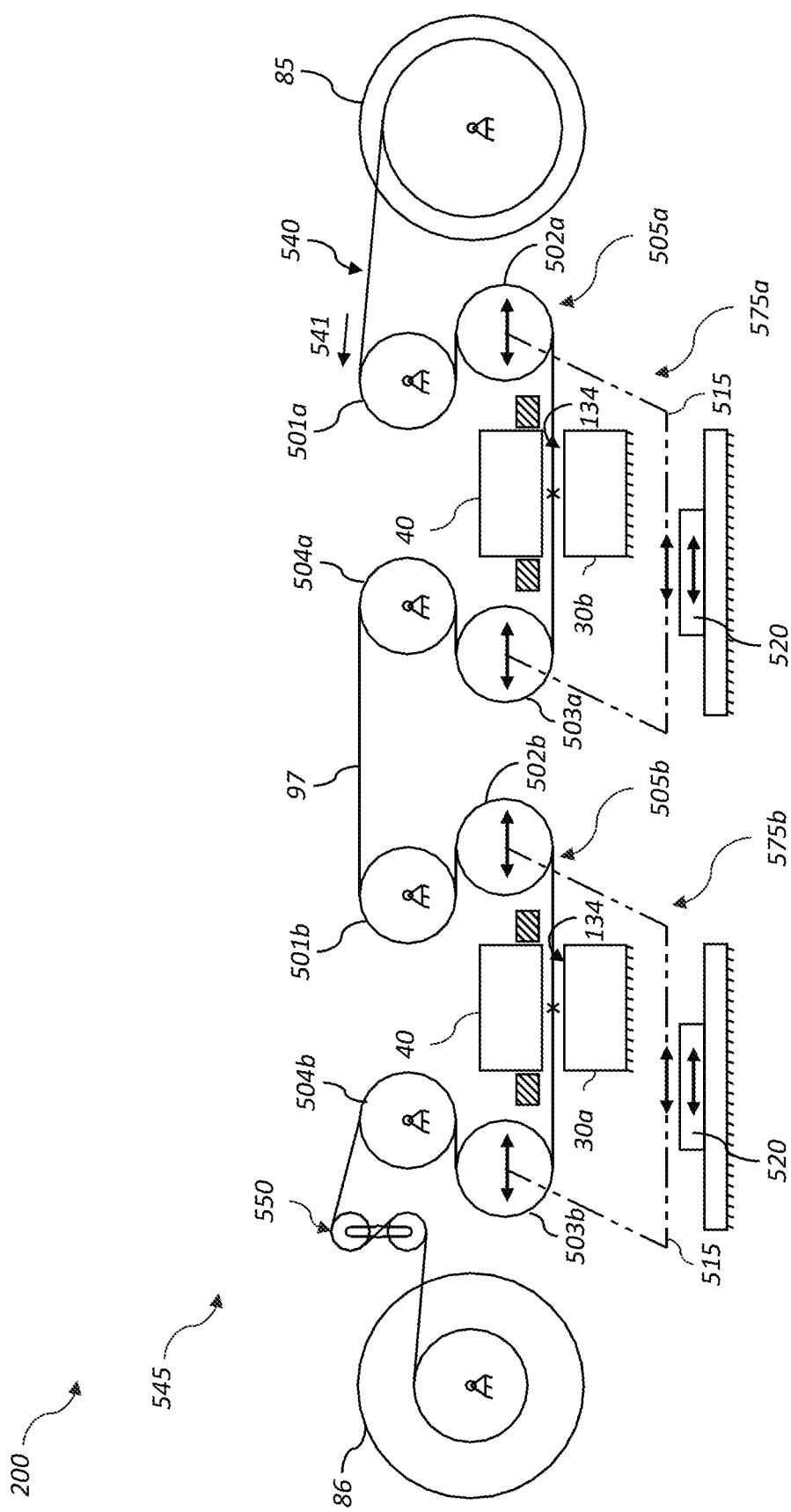
FIG. 19 illustrates an exemplary configuration for a roll-to-roll thin film deposition system having two processing stations.

In the configuration of shown in FIG. 19, multiple processing stations 575a, 575b are installed in independent portions of the web transport path 540 of the web transport system 545, each having an associated deposition head 30a, 30b and a corresponding moveable portions 505a, 505b that should be understood from the previous descriptions. The processing station 575a includes fixed-position web guides 501a, 504a and moveable portion 505a with moveable-position web guides 502a, 503a. The processing station 575b includes fixed-position web guides 501b, 504b and moveable portion 505b with moveable-position web guides 502b, 503b. It should be understood that the motion of the web of substrate 97 in the moveable portion 505a is independent of the motion of the web of substrate 97 in moveable portion 505b. While the continuous motion component of the web of substrate 97 traveling along the web transport path 540 will be the same in both processing stations 575a, 575b, the associated moveable portions 505a, 505b can be independently controlled to suit complex processing, such as layer build up schedules or coating station design peculiarities. In an exemplary embodiment, each processing station performs an SALD deposition process; however, in alternative embodiments the process at each station can be different and can be chosen as best suited for the application. As in previous embodiments, the web transport path 540 of FIG. 19 is from right-to-left, and contains a single tension control component 550 to control the web tension of the overall web transport system 545.

Figure 20:
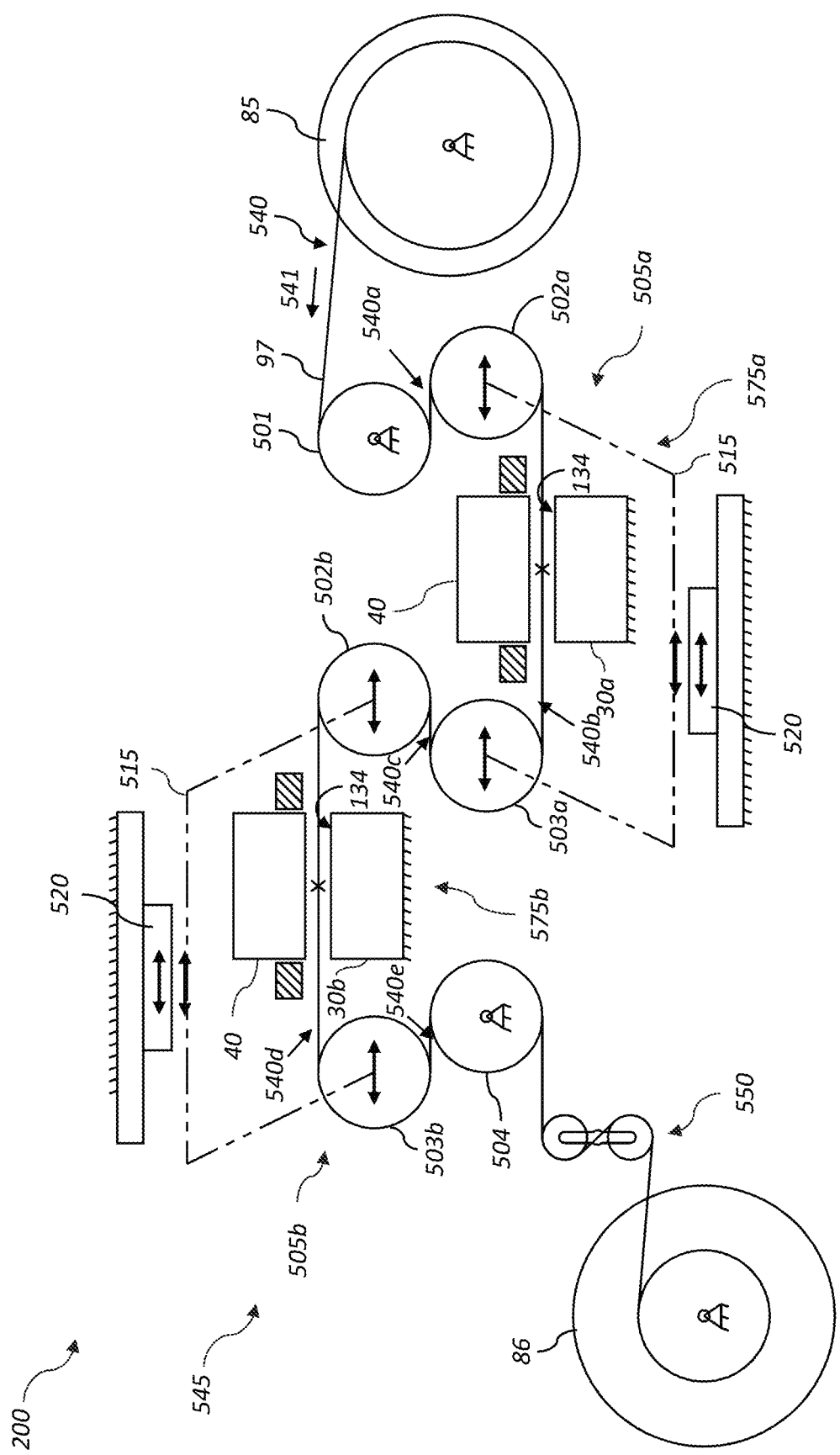
FIG. 20 illustrates an exemplary configuration for a roll-to-roll thin film deposition system having two processing stations.

FIG. 20 illustrates an alternative embodiment including multiple processing stations 575a, 575b. As in the example shown in FIG. 19, the processing station 575a moveable portion 505a with moveable-position web guides 502a, 503a and the processing station 575b includes moveable portion 505b with moveable-position web guides 502b, 503b. However, in this case, rather than each processing station 575a, 575b having its own pair of fixed-position web guides, a single pair of fixed-position web guides 501, 504 is used. The length of the web transport path 540 between the fixed-position web guides 501, 504 remains constant, and the web of substrate 97 can be moved independently in the two processing station 575a, 575b using the independent moveable portions 505a, 505b. Moveable portion 505a has the required three parallel web transport path portion 540a, 540b, 540c. Similarly, moveable portion 505b also has the required three parallel web transport path portion 540c, 540d, 540e, where the web transport path portion 540c is shared by both processing stations 575a, 575b. Described another way, the two independent moveable portions 505a, 505b each have the required two sets of 180 degree wrap angles in their associated web path. The motion of the moveable portions 505a, 505b is controlled so that the axes of the moveable-position web guide 503a cannot move past the axes of the moveable-position web guide 502b so that a web transport path portion 540c is maintained between the two elements. In alternative embodiments (not shown), a single moveable portion 505 can have two or more independent process regions for efficiency in throughput for well-defined sequential process steps. The remaining elements of FIG. 20 should be understood from the previous descriptions.

Figure 21:
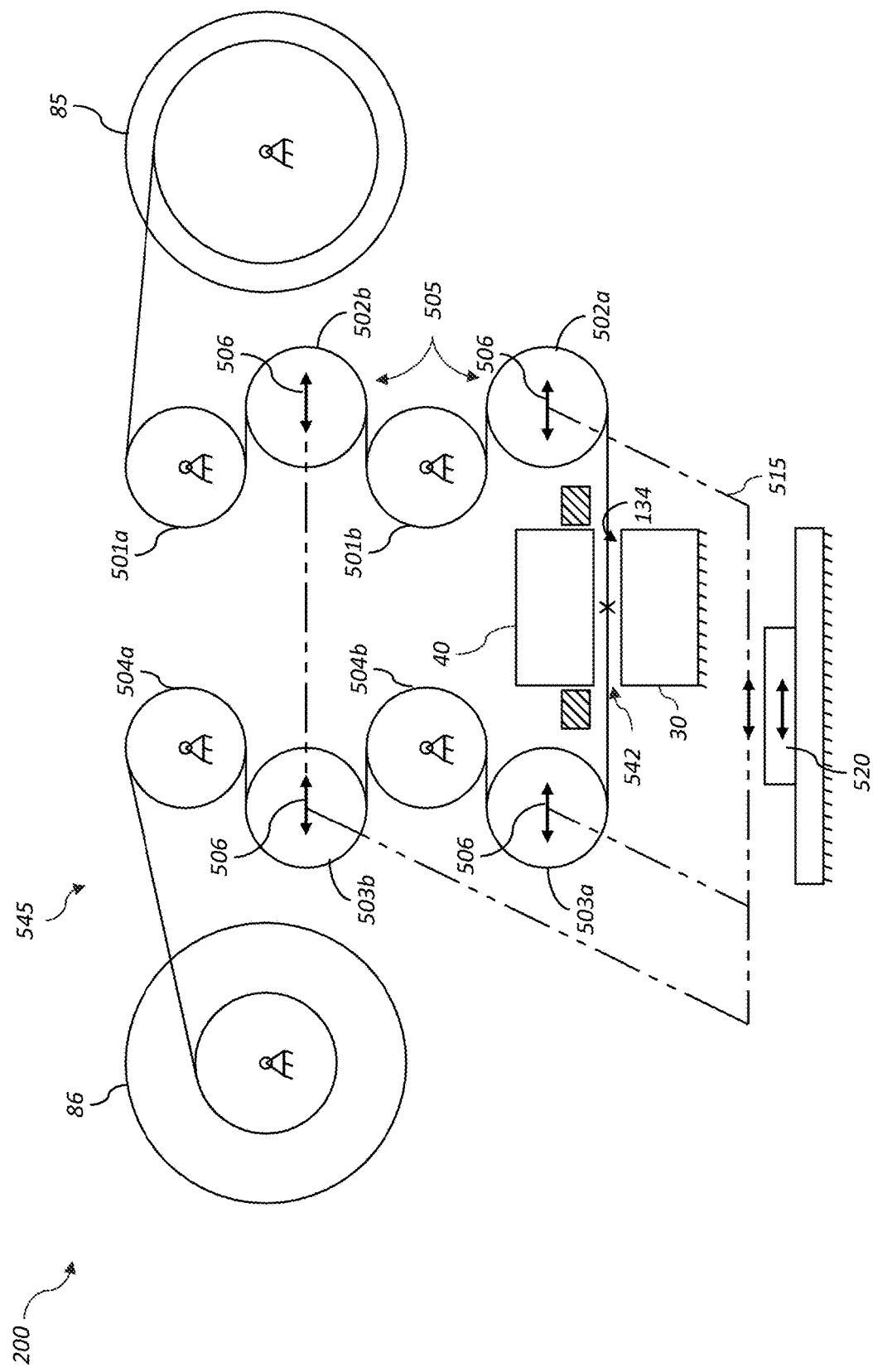
FIG. 21 is a cross-sectional view of a roll-to-roll thin film deposition system including two pairs of moveable-position web guide to provide a 4:1 motion ratio.

The number of moveable-position web guides in independent motion control portions of the present invention is not limited to two. FIG. 21 illustrates an embodiment of a web transport system 545 having a moveable portion 505 with four moveable-position web guide 502a, 502b, 503a, 503b and four fixed-position web guides 501a, 501b, 504a, 504b. The moveable portion 505 is configured with a first pair of moveable-position web guides 502a, 503a and a second pair of moveable-position web guides 502b, 503b mounted on a common carriage 515. Likewise, the fixed components are also configured with a first pair of fixed-position web guides 501a, 504a and a second pair of fixed-position web guides 501b, 504b. As should be understood from the previous description, the individual elements within each pair of web guides can have an independent size, shape and position as required by the application so long as they form the necessary web path. In some embodiment one or both of the pairs of moveable-position web guides 502a, 502b, 503a, 503b can be replaced by a single monolithic moveable structure 530, as was illustrated in FIG. 12. The common carriage 515 moves both pairs of moveable-position web guides 502a, 502b, 503a, 503b in unison, which moves the web of substrate 97 within the process region 542 by an amount that is four times the distance moved by the common carriage 515. In other embodiments, the first pair of moveable-position web guides 502a, 503a and the second pair of moveable-position web guides 502b, 503b can be mounted on separate carriages 515 and can be moved by separate actuators that are controlled together as motion actuation system. While the motion directions 506 of the first pair of moveable-position web guides 502a, 503a and the second pair of moveable-position web guides 502b, 503b is shown as being parallel in this figure, there is no requirement that this be true. The only requirement is that the motion direction 506 associated with a particular pair of moveable-position web guides be parallel to the direction that the web of media 97 enters and exits each of the web guides in that pair.

Figure 22:
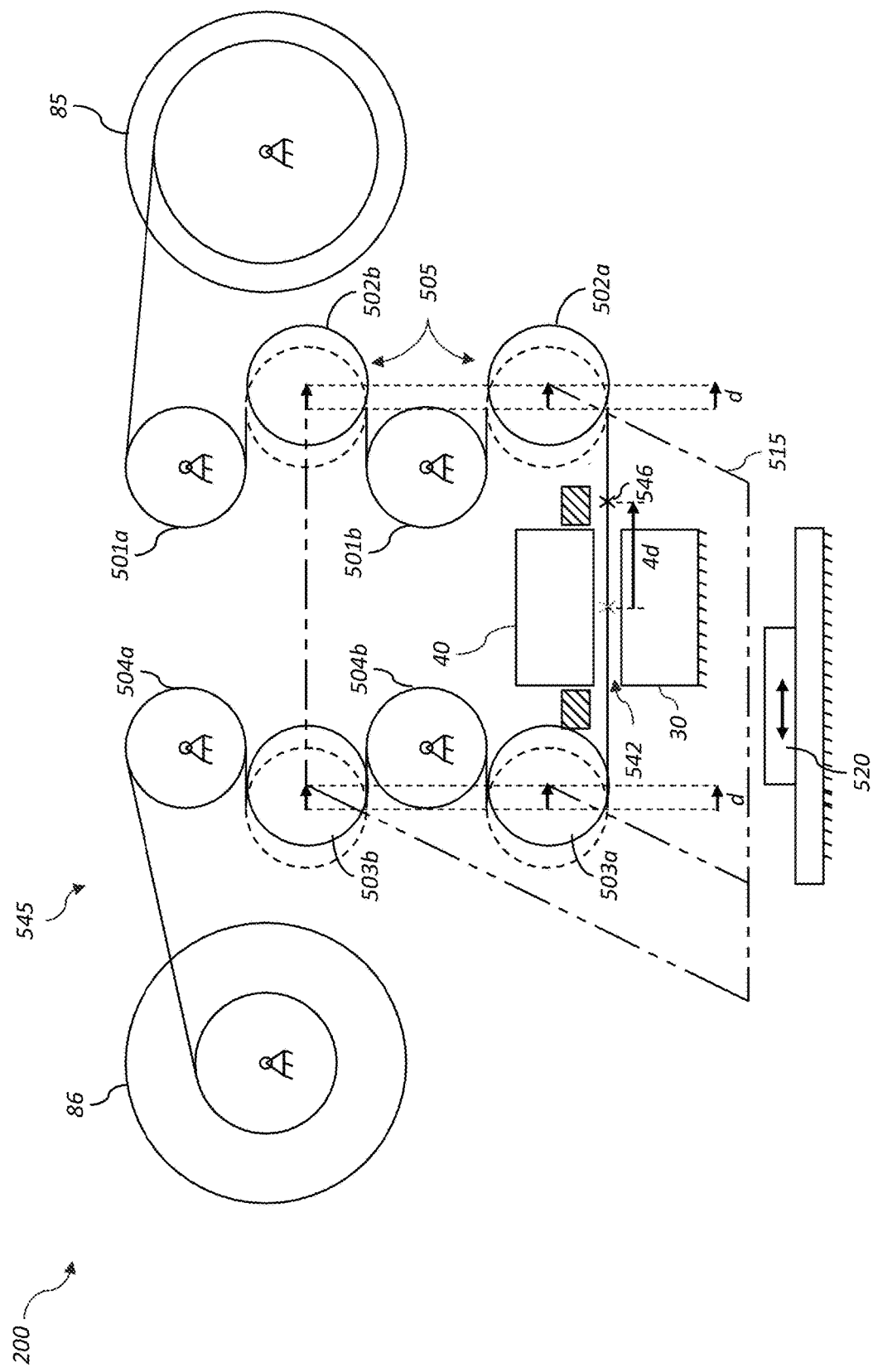
FIG. 22 illustrates the movement of the moveable portion of the web transport system in the configuration of FIG. 21 and the corresponding displacement of the web of substrate.

As should be understood from the single pair embodiment discussed with respect to FIGS. 4-6, each pair of moveable-position web guides 502, 503 contributes a movement of 2d within the process region 542 when the moveable portion 505 is moved a distance d. For the two pair arrangement of FIG. 21, the total distance moved will therefore be 4d. FIG. 22 illustrates the web transport system 545 of FIG. 12 after the carriage 515 has moved by a distance d. a substrate point 546 in the process region 542 has moved by a distance 4d as indicated. The two pair arrangement also results an instantaneous velocity and linear acceleration of the web in the process region 542 that is 4× that of the carriage 515 due to the doubling of displacement over the same amount of time by each pair of moveable-position web guides 502, 502. The number of pairs of moveable-position web guides 502, 502 can be optimized for the application and desired web motion, where each pair will contribute 2d of web motion in the process section for every distance d that the common carriage 515 is moved. The embodiment illustrated in FIGS. 21-22 has the advantage that a larger amplitude of web motion in the process region 542 can be achieved for a given motion of the carriage 515.

In an alternate embodiment, the web guide 502a, 503a in FIG. 21 can be fixed, and only the moveable-position web guide 502b, 503b are included in the moveable portion 505. This has the advantage that the web guides near the deposition head 30 and gas-bearing backer 40 are not moving, and thus can be positioned closer (laterally) to the deposition head 30 without interfering with the deposition head 30 or the gas-bearing backer 40 during motion.

In the described configurations, the moveable portion 505 is controlled to provide a periodic oscillatory motion while the web transport control system 560 moves the web of substrate 97 from along the web transport path 540 at a constant velocity. This provides the ability to process long spans of the web of substrate 97. In other configurations the independently controllable moveable portion 505 can also be utilized to coat isolated patches on the web of substrate 97. In this case, the overall motion of the web transport system 545 is configured to move in increments, and is then held in a static position while a patch of substrate 97 is processed by the oscillations of the moveable portion 505. The moveable portion 505 can be controlled to move in any manner necessary to achieve the desired final processed result, including a simple oscillating motion of a fixed amplitude or an oscillatory motion where the amplitude of movement is variable as a function of time (or the number of oscillations).

In some embodiments, the web transport control system 560 may modify the web advance velocity during operation of the SALD system 200. For example, the web advance velocity can be increased or decreased (thereby effectively modifying the "ooch distance") to modify the number of coating layers that are applied in different portions of the web of substrate 97. In some cases, the web advance velocity can be set to zero so that the web of substrate 97 does not advance along the web transport path 540 for some period of time while the moveable portion 505 continues to execute its oscillatory motion pattern in order to perform SALD deposition along only a short portion of the web of substrate 97.

In the illustrated configurations, the web of substrate 97 travels from a supply roll 85 to a take-up roll 86. However, in other configurations one or both of these rolls may not be present. For example, rather than the web of media being taken up on a take-up roll 86 it may be fed directly into a finishing system which can perform other types of operations including cutting operations that cut the web of substrate 97 into pieces. In other configurations, the web of substrate 97 may be a strip of substrate 97 whose ends are held by fixed-position clamping mechanisms (e.g., located in the positions of the supply roll 85 to a take-up roll 86. In this case, the web of substrate 97 would follow the web transport path 540 but would not be advanced along the web transport path 540 during operation of the SALD system 200, therefore a web transport control system 560 is not necessary.

The invention has been described in detail with particular reference to certain preferred embodiments thereof, but it will be understood that variations and modifications can be effected within the spirit and scope of the invention.

PARTS LIST 15 external environment
30 deposition head
30a deposition head
30b deposition head
40 gas-bearing backers
85 supply roll
86 take-up roll
94 working distance
97 substrate
98 motion arrow
110 gas slot
112 output slot
114 exhaust slot
134 output face
200 SALD system
205 deposition subsystem
210 deposition unit
270 relative motion means
280 substrate positioner module
284 flexure
305 deposition zone
308 inert zone
309 inert zone
313 first reactive gas zone
314 purge zone
315 second reactive gas zone
321 left edge
322 right edge
401 output slots
501 fixed-position web guide
501a fixed-position web guide
501b fixed-position web guide
502 moveable-position web guide
502a moveable-position web guide
502b moveable-position web guide
503 moveable-position web guide
503a moveable-position web guide
503b moveable-position web guide
504 fixed-position web guide
504a fixed-position web guide
504b fixed-position web guide
505 moveable portion
505a moveable portion
505b moveable portion
506 motion direction
507 fixed-position web guide
508 web guide structure
510 fixed portion
515 carriage
520 motion actuator
530 moveable structure
540 web transport path
540a web transport path portion
540b web transport path portion
540b' web transport path portion
540c web transport path portion
540d web transport path portion
540e web transport path portion
541 in-track direction
542 process region
543 first position
544 second position
545 web transport system
546 substrate point
548 entrance portion
549 exit portion
550 tension control component
560 web transport control system
575a processing station
575b processing station
602 moveable-position web guide
603 moveable-position web guide

The invention claimed is:

1. A thin film deposition system for depositing a material onto a web of substrate travelling in an in-track direction along a web transport path, comprising:
a web guide system having a plurality of web guides defining a web transport path for the web of substrate, the web guide system including:
an entrance portion;
an exit portion; and
a moveable portion along the web transport path between the entrance portion and the exit portion, the moveable portion including:
a first moveable-position web guide; and
a second moveable-position web guide;
wherein the web transport path directs the web of substrate through the entrance portion, then around the first moveable-position web guide, then around the second moveable-position web guide, then through the exit portion at a substantially constant web advance velocity;
a deposition head for depositing the material onto a surface of the web of substrate as the web of substrate moves relative to the deposition head, the deposition head being located in a fixed position adjacent to the web of substrate along the web transport path between the first moveable-position web guide and the second moveable-position web guide; and
a motion actuator system that is configured to synchronously move positions of the first and second moveable-position web guides such that they move forward and backward in a moveable portion motion direction according to a defined oscillating motion pattern while maintaining a constant distance between the first and second moveable-position web guides, thereby causing a portion of the web of substrate adjacent to the deposition head to move forward and backward in the in-track direction, so as to provide for a composite motion profile of the web of substrate adjacent to the deposition head in which the motion actuator system causes the forward and backward movement of the web of substrate adjacent to the deposition head while the web of substrate moves along the web transport path at the substantially constant web advance velocity and while the deposition head supplies material onto the surface of the web of substrate, wherein the backward movement of the web of substrate is smaller in distance than the forward movement of the web of substrate;

wherein the web of substrate enters and exits the first and second moveable-position web guides in directions that are substantially parallel to the moveable portion motion direction; and wherein the web of substrate wraps around the first moveable-position web guide with a wrap angle substantially equal to 180 degrees and the web of substrate wraps around the second moveable-position web guide with a wrap angle substantially equal to 180 degrees, the wrap angle around the first moveable-position web guide being an angle in degrees in which the web of substrate wraps around the first moveable-position web guide from an entrance location to the first moveable-position web guide where the substrate first contacts the first movable-position web guide to an exit location from the first moveable-position web guide which is a last point of contact between the substrate and the first movable-position web guide, and the wrap angle around the second moveable-position web guide being an angle in degrees in which the web of substrate wraps around the second moveable-position web guide from an entrance location to the second moveable-position web guide where the substrate first contacts the second movable-position web guide to an exit location from the second moveable-position web guide which is a last point of contact between the substrate and the second movable-position web guide; and wherein the motion actuator system is configured to move the positions of the first and second moveable-position web guides in accordance with the oscillating motion pattern, wherein a substrate point at the portion of the web of substrate between the first and second moveable-position web guides and adjacent to the deposition head is displaced by a distance that is two times greater than a displacement distance of the first and second movable-position web guides.

2. The thin film deposition system of claim 1, wherein the first and second moveable-position web guides are mounted onto a rigid carriage, and the motion actuator system moves the positions of the first and second moveable-position web guides by controlling a position of the rigid carriage in accordance with the oscillating motion pattern.

3. The thin film deposition system of claim 1, wherein a first motion actuator is used to control the position of the first moveable-position web guide and a second motion actuator is used control the position of the second moveable-position web guide, and wherein the motion actuator system is configured to control the positions of the first and second moveable-position web guides by controlling the first and second motion actuators in a synchronous manner in accordance with the oscillating motion pattern.

4. The thin film deposition system of claim 1, wherein the entrance portion of the web guide system includes a supply roll from which the web of substrate is supplied, and the exit portion of the web guide system includes a take-up roll onto which the web of substrate is taken up.

5. The thin film deposition system of claim 4, wherein the web transport path between the supply roll and the first moveable-position web guide follows a straight path which is not redirected by any intervening web guides, and the web transport path between the second moveable-position web guide and the take-up roll follows a straight path which is not redirected by any intervening web guides.

6. The thin film deposition system of claim 1, wherein the entrance portion of the web guide system includes a first fixed-position web guide, and the exit portion of the web guide system includes a second fixed-position web guide, and wherein the web transport path directs the web of substrate around the first fixed-position web guide, then around the first moveable-position web guide, then around the second moveable-position web guide, then around the second fixed position web guide.

7. The thin film deposition system of claim 6, wherein the first fixed-position web guide and the first moveable-position web guide are positioned such that a tangent line between a bottom of the first fixed-position web guide and a top of the first moveable-position web guide is parallel to an output face of the deposition head, and the second fixed-position web guide and the second moveable-position web guide are positioned such that a tangent line between a top of the second moveable-position web guide and a bottom of the second fixed-position web guide is parallel to the output face of the deposition head.

8. The thin film deposition system of claim 1, wherein the web guide system further includes a second moveable portion including a third moveable-position web guide upstream and a fourth moveable-position web guide, and wherein the motion actuator system is configured to synchronously move positions of the third and fourth moveable-position web guides such that they move forward and backward in a second moveable portion motion direction according to an oscillating motion pattern while maintaining a constant distance between the third and fourth moveable-position web guides, and wherein the web of substrate enters and exits the third and fourth moveable-position web guides in directions that are substantially parallel to the second moveable portion motion direction, wherein the substrate point is adapted to be displaced by a distance that is four times greater than a displacement distance of the first and second movable-position web guides and the third and fourth movable position web guides.

9. The thin film deposition system of claim 8, wherein the first, second, third and fourth moveable-position web guides are all mounted onto a single rigid carriage, and wherein the motion actuator system is configured to move the positions of the first, second, third and fourth moveable-position web guides by controlling a position of the rigid carriage in accordance with the oscillating motion pattern.

10. The thin film deposition system of claim 8, wherein the third moveable-position web guide is upstream of the first moveable-position web guide and the fourth moveable-position web guide is downstream of the second moveable-position web guide, and further including a first fixed-position web guide located along the web transport path between the third moveable-position web guide and a second fixed-position web guide located along the web transport path between the second moveable-position web guide and the fourth moveable-position web guide.

11. The thin film deposition system of claim 8, wherein the third moveable-position web guide and the fourth moveable-position web guide are downstream of the second moveable-position web guide, and further including a second deposition head located in a fixed position adjacent to the web of substrate along the web transport path between the third moveable-position web guide and the fourth moveable-position web guide.

12. The thin film deposition system of claim 8, further including one or more fixed-position web guides that redirect the web transport path between the second moveable-position web guide and the third moveable-position web guide.

13. The thin film deposition system of claim 8, wherein the web transport path portion between the second moveable-position web guide and the third moveable-position web guide follows a straight path which is not redirected by any intervening web guides.

14. The thin film deposition system of claim 1, wherein at least one of the first and second moveable-position web guides is a web guide unit including two or more individual web guides.

15. The thin film deposition system of claim 1, wherein the web transport path portion between the first moveable-position web guide and the second moveable-position web guide follows a straight path which is not redirected by any intervening web guides.

16. The thin film deposition system of claim 15, wherein an output face of the deposition head is parallel to the web transport path portion between the first moveable-position web guide and the second moveable-position web guide.

17. The thin film deposition system of claim 1, further including two or more additional fixed-position web guides positioned along the web transport path between the first moveable-position web guide and the second moveable-position web guide, wherein the deposition head is located in a fixed position adjacent to the web of substrate along the web transport path between two of the additional fixed-position web guides.

18. The thin film deposition system of claim 1, wherein the first and second moveable-position web guides are portions of a monolithic moveable structure.

19. The thin film deposition system of claim 1, further including a web tension control system that maintains a substantially constant web tension for the web of substrate.

20. The thin film deposition system of claim 1, wherein at least one of the first and second moveable-position web guides is a roller that rotates around a roller axis.

21. The thin film deposition system of claim 1, wherein at least one of the first and second moveable-position web guides is a non-rotating gas-bearing turn bar.

22. The thin film deposition system of claim 1, wherein the deposition head exposes the surface of the web of substrate to a plurality of gaseous materials.

23. The thin film deposition system of claim 22, wherein an output face of the deposition head includes:
  a first inert zone wherein an inert gaseous material is supplied;
  a second inert zone wherein an inert gaseous material is supplied; and
  a deposition zone located between the first inert zone and the second inert zone along the in-track direction where the first substrate surface is exposed to one or more reactive gaseous materials to deposit one or more layers of material onto web of substrate.

24. The thin film deposition system of claim 23, wherein the motion actuator system is configured to control the oscillating motion pattern of the first and second moveable-position web guides such that after a first layer of the material has been deposited onto a particular point on the web of substrate the particular point on the web of substrate does not move beyond outer boundaries of the first inert zone and the second inert zone until all layers of the material have been deposited onto the particular point on the web of substrate.

25. A thin film deposition system for depositing a material onto a web of substrate, comprising:
  a web guide system having a plurality of web guides defining a web transport path for the web of substrate, the web guide system including:
    an entrance portion;
    an exit portion; and
    a moveable portion along the web transport path between the entrance portion and the exit portion, the moveable portion including:
      a first moveable-position web guide unit; and
      a second moveable-position web guide unit;
    wherein the web transport path directs the web of substrate through the entrance portion, then around the first moveable-position web guide unit, then around the second moveable-position web guide unit, then through the exit portion at a substantially constant web advance velocity;
  a deposition zone for depositing the material onto a surface of the web of substrate, the deposition zone being located in a fixed position adjacent to the web of substrate along the web transport path between the first moveable-position web guide unit and the second moveable-position web guide unit; and
  a motion actuator system that is configured to synchronously move positions of the first and second moveable-position web guide units such that they move forward and backward in a motion direction according to an oscillating motion pattern while maintaining a constant distance between the first and second moveable-position web guide units, thereby causing a portion of the web of substrate adjacent to the deposition zone to move forward and backward in an in-track direction, so as to provide for a composite motion profile of the web of substrate at the deposition zone in which the motion actuator system causes the forward and backward movement of the web of substrate at the deposition zone while the web of substrate moves along the web transport path at the substantially constant web advance velocity and while the deposition zone supplies material onto the surface of the web of substrate, wherein the backward movement of the web of substrate is smaller in distance than the forward movement of the web of substrate;
  wherein the web of substrate enters and exits the first and second moveable-position web guide units in directions that are substantially parallel to the motion direction; and
  wherein the web of substrate wraps around the first moveable-position web guide unit with a wrap angle substantially equal to 180 degrees and the web of substrate wraps around the second moveable-position web guide unit with a wrap angle substantially equal to 180 degrees, the wrap angle around the first moveable-position web guide unit being an angle in degrees in which the web of substrate wraps around the first moveable-position web guide unit from an entrance location to the first moveable-position web guide unit where the substrate first contacts the first movable-position web guide unit to an exit location from the first moveable position-web guide unit which is a last point of contact between the substrate and the first movable-position web guide unit, and the wrap angle around the second moveable-position web guide unit being an angle in degrees in which the web of substrate wraps around the second moveable-position web guide unit from an entrance location to the second moveable-position web guide unit where the substrate first contacts the second movable-position web guide unit to an exit location from the second moveable-position web guide unit which is a last point of contact between the substrate and the second movable-position web guide unit; and wherein the motion actuator system is configured to move the positions of the first and second moveable-position web guide units in accordance with the oscillating motion pattern, wherein a substrate point at the portion of the web of substrate between the first and second moveable-position web guide units and adjacent to the deposition head is displaced by a distance that is two times greater than a displacement distance of the first and second moveable-position web guide units.

* * * * *